(12) United States Patent
Hara et al.

(10) Patent No.: US 8,207,514 B2
(45) Date of Patent: Jun. 26, 2012

(54) CHARGED PARTICLE BEAM DRAWING APPARATUS AND PROXIMITY EFFECT CORRECTION METHOD THEREOF

(75) Inventors: Shigehiro Hara, Kanagawa (JP); Shuichi Tamamushi, Kanagawa (JP); Takashi Kamikubo, Tokyo (JP); Hitoshi Higurashi, Kanagawa (JP); Shinji Sakamoto, Kanagawa (JP); Yusuke Sakai, Kanagawa (JP); Yoshihiro Okamoto, Kanagawa (JP); Akihito Anpo, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 94 days.

(21) Appl. No.: 12/882,713

(22) Filed: Sep. 15, 2010

(65) Prior Publication Data
US 2011/0068281 A1 Mar. 24, 2011

(30) Foreign Application Priority Data

Sep. 18, 2009 (JP) ................................. 2009-216469

(51) Int. Cl.
*G21K 5/10* (2006.01)

(52) U.S. Cl. ............. 250/492.22; 250/492.1; 250/492.2; 250/492.3

(58) Field of Classification Search .... 250/492.1–492.3; 438/473, 474
See application file for complete search history.

(56) References Cited

FOREIGN PATENT DOCUMENTS
JP 2003-318077 11/2003

*Primary Examiner* — Michael Maskell
(74) *Attorney, Agent, or Firm* — Oblon, Spivak, McClelland, Maier & Neustadt, L.L.P.

(57) ABSTRACT

A charged particle beam drawing apparatus forms a map having meshes, forms representative figures, area of each representative figure in each mesh being equal to gross area of figures in each mesh, and calculates a proximity effect correction dose of the charged particle beam in each mesh on the basis of area of each representative figure in each mesh. If it is necessary to change the proximity effect correction dose of the charged particle beam for drawing at least one pattern corresponding to at least one figure, the charged particle beam drawing apparatus changes area of the at least one figure before the representative figures are formed by a representative figure forming portion, and changes the proximity effect correction dose of the charged particle beam for drawing the at least one pattern corresponding to the at least one figure, calculated by a proximity effect correction dose calculating portion.

10 Claims, 17 Drawing Sheets

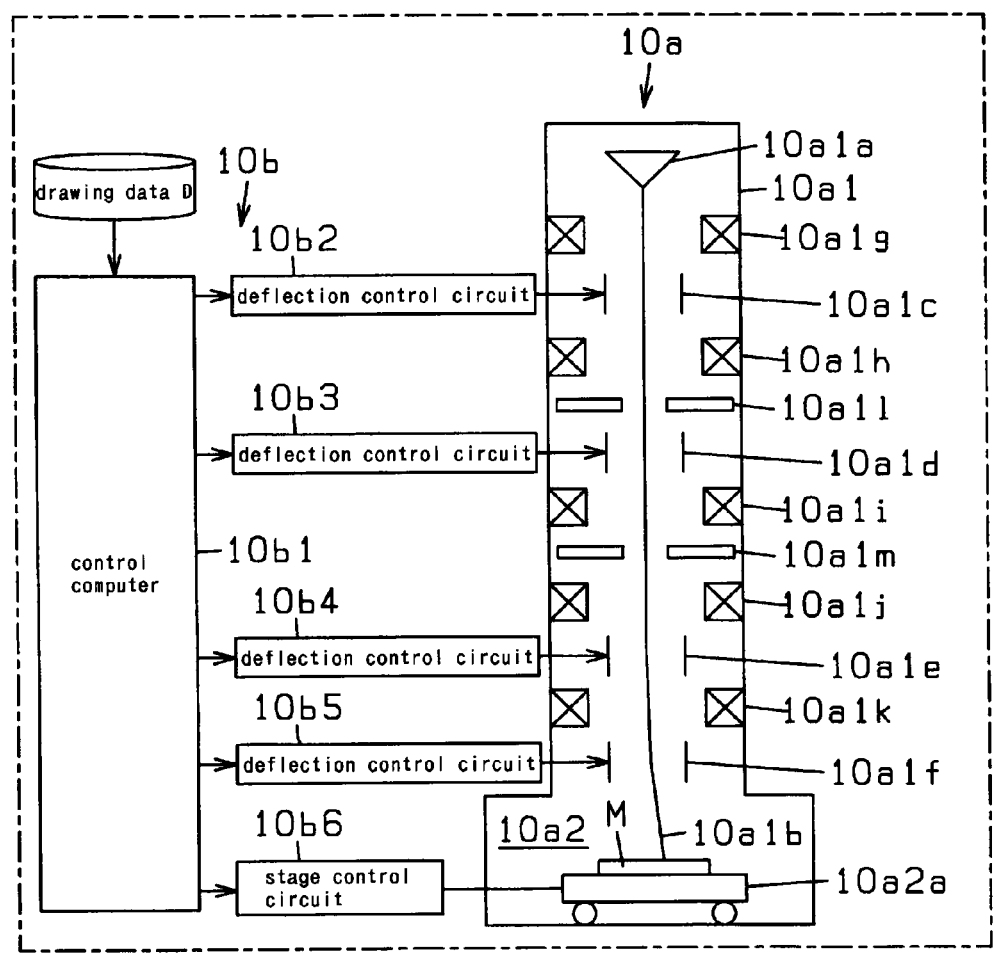
FIG. 1 charged particle beam drawing apparatus 10

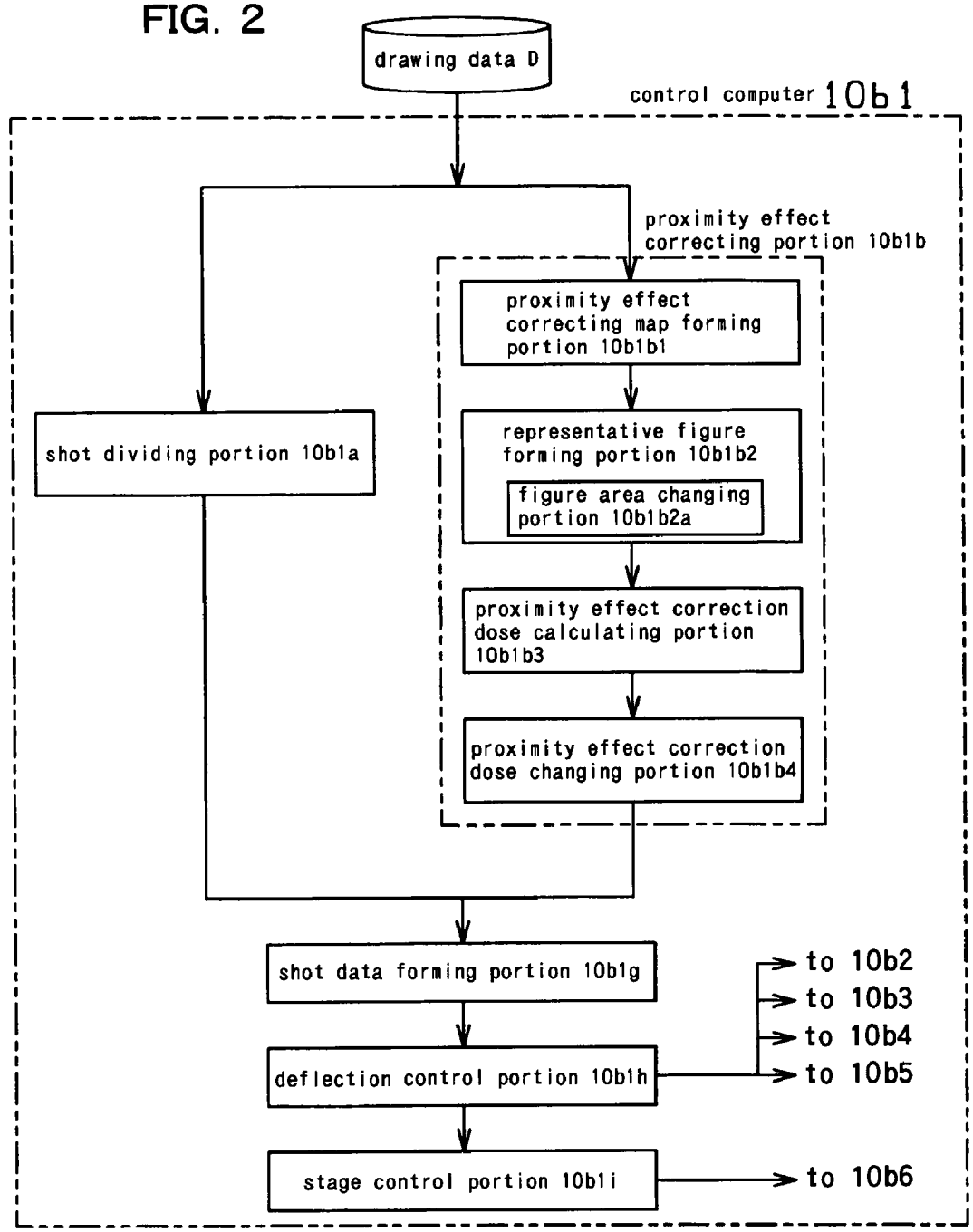

P1a

P1b

P1c

P1d

P1e

P1f

P1g

P1h

P1i — P1

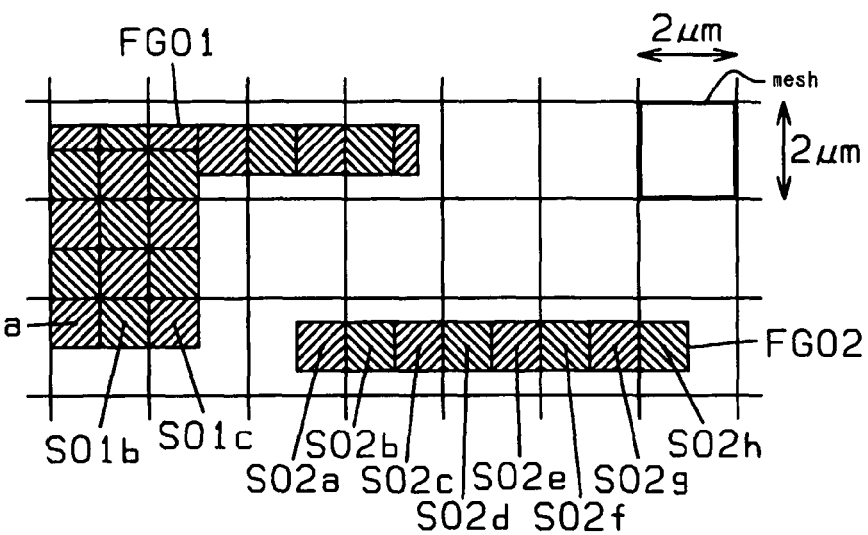

$$Sf20c \leftarrow Sf20 \times (1-x2/100)$$
$$Sf30c \leftarrow Sf30 \times (1-x2/100)$$
$$Sf40c \leftarrow Sf40 \times (1-x2/100)$$
$$Sf50c \leftarrow Sf50 \times (1-x2/100)$$
$$Sf60c \leftarrow Sf60 \times (1-x2/100)$$

$$D20d \leftarrow D20" \times (1-x2/100)$$
$$D30d \leftarrow D30" \times (1-x2/100)$$
$$D40d \leftarrow D40" \times (1-x2/100)$$
$$D50d \leftarrow D50" \times (1-x2/100)$$
$$D60d \leftarrow D60" \times (1-x2/100)$$

| header(type code=1) |
| index number list(index number=1) |
| data of figure FG10 |
| data of figure FG11 |
| data of figure FG12 |
| header(type code=2) |
| index number list(index number=2) |
| data of figure FG20 |
| data of figure FG21 |
| data of figure FG22 |

} first figure group data

} second figure group data

FIG. 10A

| index number | changing ratio |
|---|---|
| 01 | 0% |
| 02 | +20% |

FIG. 10B

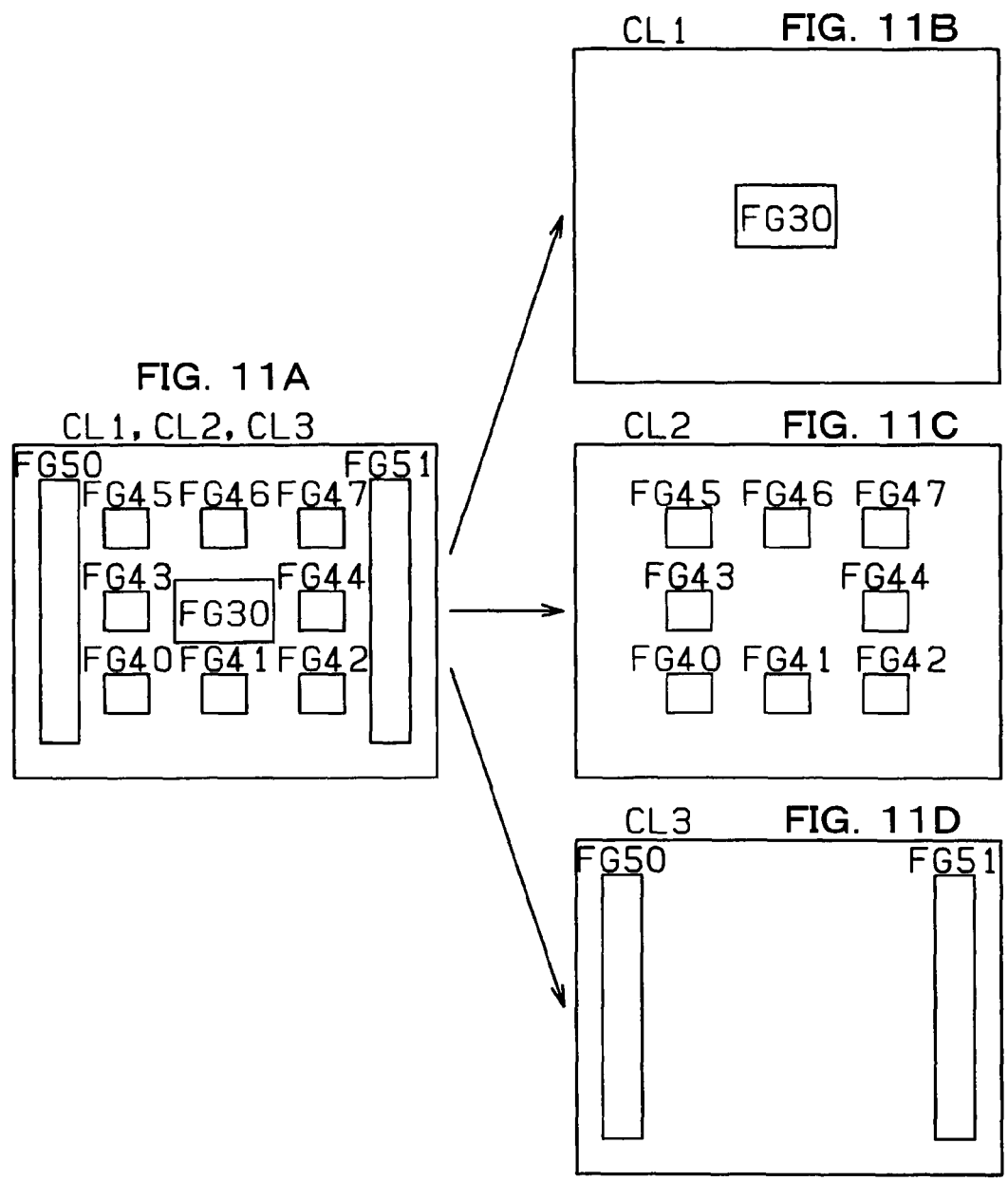

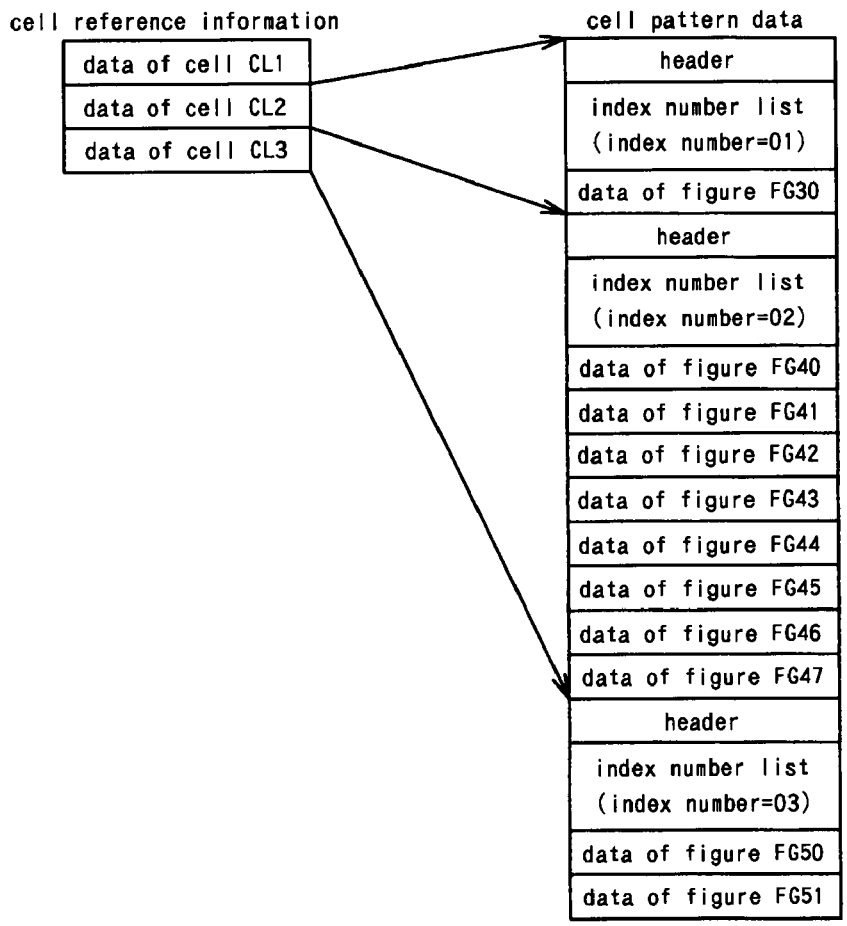

| index number | changing ratio |
|---|---|
| 01 | 0% |
| 02 | +20% |
| 03 | +40% |

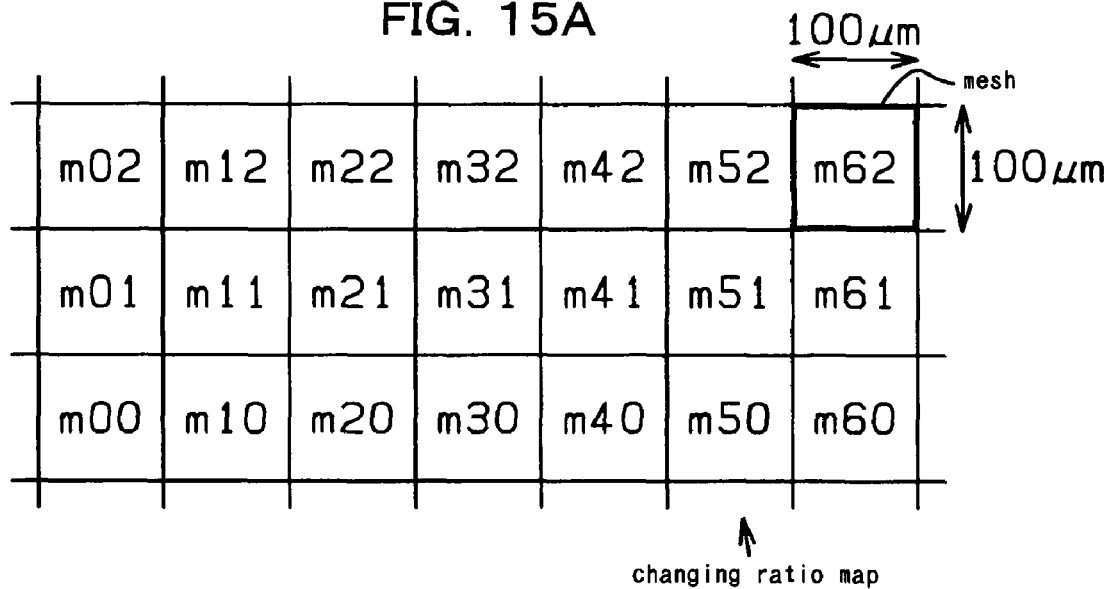

$Da'' \leftarrow Da' \times (1 + xa/100)$

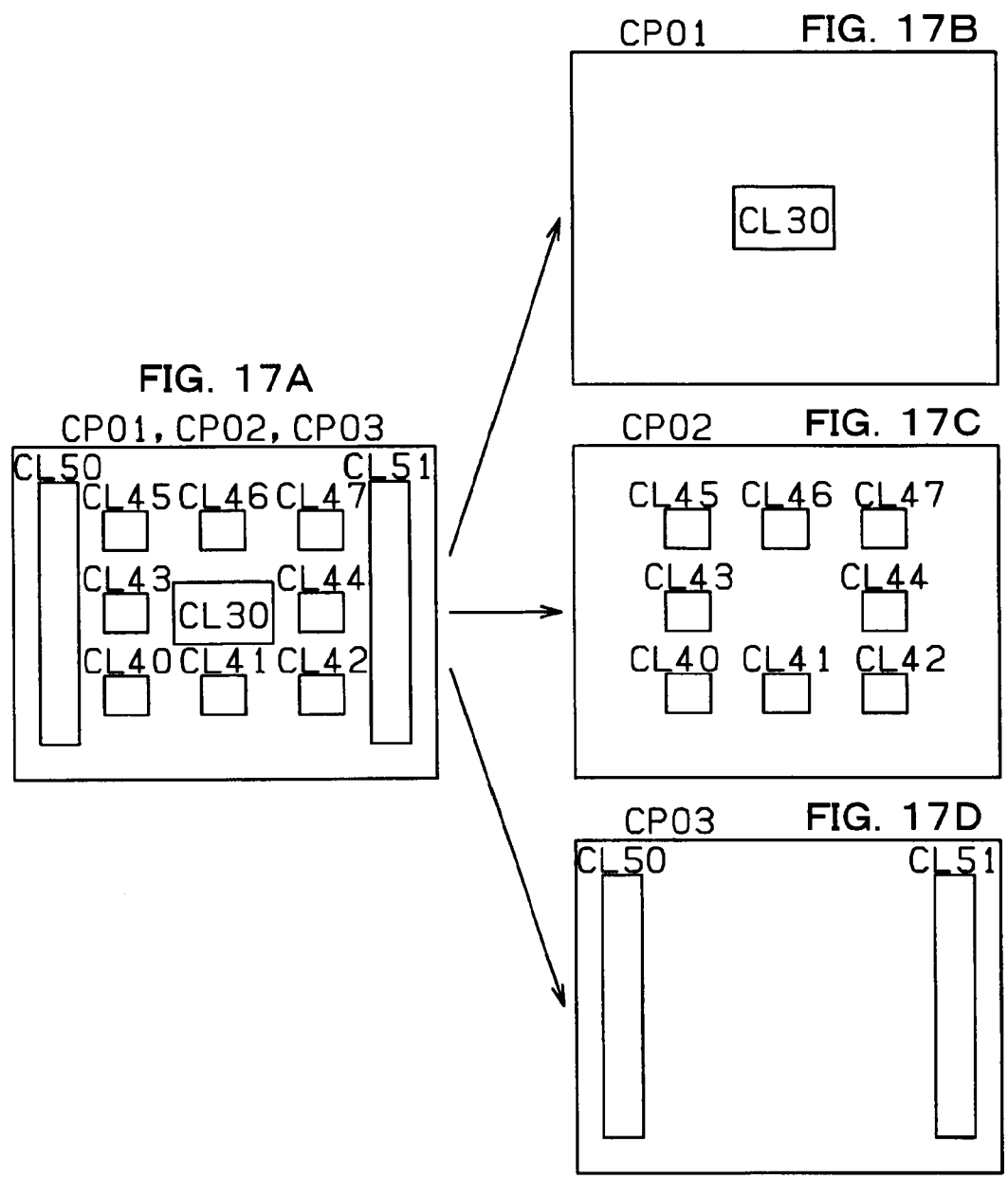

CHARGED PARTICLE BEAM DRAWING APPARATUS AND PROXIMITY EFFECT CORRECTION METHOD THEREOF

CROSS-REFERENCE TO RELATED APPLICATION

This application is based upon and claims the benefit of priority from the prior Japanese Patent Application No. 2009-216469 filed on Sep. 18, 2009 in Japan, the entire contents of which are incorporated herein by reference.

BACKGROUND OF THE INVENTION

1. Field of the Invention

The present invention relates to a charged particle beam drawing apparatus and proximity effect correction method thereof, wherein patterns corresponding to figures included in a drawing data are drawn in a drawing area of a workpiece by applying a charged particle beam to the workpiece, wherein a resist is applied to an upper surface of the workpiece.

2. Description of Related Art

As is known in the prior art, in a charged particle beam drawing apparatus, patterns corresponding to figures included in a drawing data (EB data) are drawn in a drawing area of a workpiece, such as a mask substrate (reticle) and a wafer, by applying a charged particle beam to the workpiece, wherein a resist is applied to an upper surface of the workpiece. For example, the charged particle beam drawing apparatus in the prior art is described in Japanese Unexamined Patent Publication No. 2003-318077. In the charged particle beam drawing apparatus described in Japanese Unexamined Patent Publication No. 2003-318077, a proximity effect correcting map having meshes is formed, the size of each mesh being 2 μm×2 μm, so that figures included in the drawing data (EB data) are placed in the proximity effect correcting map (see FIGS. 10(a) and 10(c), and paragraph 0095 of Japanese Unexamined Patent Publication No. 2003-318077). Then, in the charged particle beam drawing apparatus described in Japanese Unexamined Patent Publication No. 2003-318077, representative figures are formed, wherein area of a representative figure is equal to gross area of figures placed in a mesh (see FIG. 10(c) and paragraph 0096 of Japanese Unexamined Patent Publication No. 2003-318077). Then, in the charged particle beam drawing apparatus described in Japanese Unexamined Patent Publication No. 2003-318077, a proximity effect correction dose (optimum dose D(x)) of the charged particle beam in each mesh is calculated by solving proximity effect correction equations (see paragraph 0030 of Japanese Unexamined Patent Publication No. 2003-318077), wherein the size of each mesh is 2 μm×2 μm (see FIG. 10(d) and paragraphs 0041, 0044, 0072, and 0109 of Japanese Unexamined Patent Publication No. 2003-318077).

In detail, in the charged particle beam drawing apparatus described in Japanese Unexamined Patent Publication No. 2003-318077, when the proximity effect correction dose (optimum dose D(x)) of the charged particle beam in each mesh is calculated, the size of each mesh being 2 μm×2 μm, area of representative figure in each mesh is considered. Concretely, if area of representative figure in a mesh is large, namely, if area density of figures in the mesh is large, dose of the charged particle beam for drawing patterns corresponding to figures in the mesh is large, consequently, influence of backscattering on figures in surrounding meshes is large. If area of representative figure in a mesh is small, namely, if area density of figures in the mesh is small, dose of the charged particle beam for drawing patterns corresponding to figures in the mesh is small, consequently, influence of backscattering on figures in surrounding meshes is small.

A following equation (1) shows a relation among the accumulation energy of the charged particle beam accumulated in the resist by forward-scattering of the charged particle beam (which corresponds to the left portion of the left side of the equation (1)), the accumulation energy of the charged particle beam accumulated in the resist by backscattering of the charged particle beam (which corresponds to the right portion of the left side of the equation (1)), and sum of the accumulation energy of the charged particle beam accumulated in the resist (which corresponds to the right side of the equation (1)), in the typical charged particle beam drawing apparatus in the prior art, such as the charged particle beam drawing apparatus described in Japanese Unexamined Patent Publication No. 2003-318077.

$$\frac{D(x)}{2} + \eta \int\int_{pattern} D(x')g(x-x')dx' = E_0 \quad \begin{array}{l} \text{constant in unit} \\ \text{drawing area,} \\ \text{such as a chip} \end{array} \quad (1)$$

In the equation (1), $E_0$ (right side of the equation (1)) shows the accumulation energy of the charged particle beam accumulated in a position x in the resist. In detail, x shows a location vector. In the equation (1), D(x) shows the proximity effect correction dose of the charged particle beam applied from an optical column to the position x in the resist. The left portion (D(x)/2) of the left side of the equation (1) shows the accumulation energy of the charged particle beam accumulated in the position x in the resist, after the charged particle beam is applied from the optical column to the position x in the resist. Namely, the equation (1) means that a half (D(x)/2) of the dose D(x) of the charged particle beam applied from the optical column to the position x in the resist is accumulated in the position x in the resist. The right portion of the left side of the equation (1) shows the accumulation dose of the charged particle beam accumulated in the position x in the resist by proximity effect (backscattering), after the charged particle beam is applied from the optical column to positions x' in a whole drawing area in the resist. In detail, in the equation (1), η shows a proximity effect correction coefficient, and g shows a proximity effect influence distribution. In the typical charged particle beam drawing apparatus in the prior art, Gaussian distribution (normal distribution) is used as the proximity effect influence distribution g. Following equations (2) to (8) show proximity effect correction equations used in the typical charged particle beam drawing apparatus in the prior art, such as the charged particle beam drawing apparatus described in Japanese Unexamined Patent Publication No. 2003-318077.

$$g(x-x') = \frac{1}{\pi\sigma^2}\exp\left[-\frac{(x-x')^2}{\sigma^2}\right] \quad (2)$$

$$D(x) = \sum_{n=0}^{\infty} d_n(x) \quad (3)$$

$$d_0(x) = \frac{E_0}{1/2 + \eta U(x)} \quad (4)$$

$$E_0 = (1/2 + \eta)D_{base} \quad (5)$$

-continued $$d_n(x) = \frac{\eta d_0(x)}{E_0}[d_{n-1}(x)U(x) - V_n(x)] \quad (n \geq 1) \quad (6)$$

$$U(x) = \int_{pattern} g(x - x')dx \quad (7)$$

$$V_n(x) = \int_{pattern} d_{n-1}(x')g(x - x')dx' \quad (8)$$

An equation (3) corresponds to the equation 1 in paragraph 0030 of Japanese Unexamined Patent Publication No. 2003-318077. An equation (4) corresponds to the equation 2 in paragraph 0030 of Japanese Unexamined Patent Publication No. 2003-318077. An equation (6) corresponds to the equation 3 in paragraph 0030 of Japanese Unexamined Patent Publication No. 2003-318077. An equation (7) corresponds to the equation 4 in paragraph 0030 of Japanese Unexamined Patent Publication No. 2003-318077. An equation (8) corresponds to the equation 5 in paragraph 0030 of Japanese Unexamined Patent Publication No. 2003-318077. In the equation (2), a shows a standard deviation of the proximity effect influence distribution g. In the equation (5), Dbase shows a base dose of the charged particle beam. Namely, in the typical charged particle beam drawing apparatus in the prior art, such as the charged particle beam drawing apparatus described in Japanese Unexamined Patent Publication No. 2003-318077, the proximity effect correction dose D(x) of the charged particle beam in each mesh is calculated by solving the proximity effect correction equations (equations (2) to (8)) under the condition that the sum (the right side of the equation (1)) of the accumulation energy of the charged particle beam accumulated by forward-scattering (the left portion of the left side of the equation (1)) and the accumulation energy of the charged particle beam accumulated by backscattering (the right portion of the left side of the equation (1)) is constant in a unit drawing area, such as a chip, the unit drawing area being a part of the whole drawing area of the workpiece.

When patterns are drawn on the workpiece, a correction error can appear to the patterns. In detail, in one case, a correction error can appear to the patterns throughout the unit drawing area, such as a chip. In another case, a correction error can appear to the patterns locally in the unit drawing area, such as a chip. If a correction error, in which the actual width of linear patterns are smaller than the target width of the patterns, appears to the patterns throughout the unit drawing area, such as a chip, the correction error can be solved by increasing the proximity effect correction dose D(x) of the charged particle beam in each mesh, under the condition that the sum (the right side of the equation (1)) of the accumulation energy of the charged particle beam accumulated by forward-scattering (the left portion of the left side of the equation (1)) and the accumulation energy of the charged particle beam accumulated by backscattering (the right portion of the left side of the equation (1)) is constant in a whole unit drawing area, such as a chip, in the typical charged particle beam drawing apparatus in the prior art, such as the charged particle beam drawing apparatus described in Japanese Unexamined Patent Publication No. 2003-318077. If a correction error, in which the actual width of linear patterns are larger than the target width of the patterns, appears to the patterns throughout the unit drawing area, such as a chip, the correction error can be solved by decreasing the proximity effect correction dose D(x) of the charged particle beam in each mesh, under the condition that the sum (the right side of the equation (1)) of the accumulation energy of the charged particle beam accumulated by forward-scattering (the left portion of the left side of the equation (1)) and the accumulation energy of the charged particle beam accumulated by backscattering (the right portion of the left side of the equation (1)) is constant in a whole unit drawing area, such as a chip, in the typical charged particle beam drawing apparatus in the prior art, such as the charged particle beam drawing apparatus described in Japanese Unexamined Patent Publication No. 2003-318077.

However, when a correction error appears to the patterns locally in the unit drawing area, such as a chip, if the proximity effect correction dose D(x) of the charged particle beam in some meshes in the unit drawing area is changed, and if the proximity effect correction dose D(x) of the charged particle beam in another meshes in the unit drawing area is not changed in order to solve the correction error, the condition that the sum (the right side of the equation (1)) is constant in the whole unit drawing area, such as a chip, is not fulfilled. Accordingly, in the charged particle beam drawing apparatus in the prior art, such as the charged particle beam drawing apparatus described in Japanese Unexamined Patent Publication No. 2003-318077, the proximity effect correction dose D(x) of the charged particle beam in only some meshes in the unit drawing area cannot be changed, therefore, the correction error which appears to the patterns locally in the unit drawing area, such as a chip, cannot be solved. Consequently, in the prior art, when it is necessary to solve the correction error which appears to the patterns locally in the unit drawing area, such as a chip, a conventional lithography technology or computer lithography technology is used.

In the conventional lithography technology, if it is supposed that the correction error which appears to the patterns locally in the unit drawing area, such as a chip, is caused by resist process, such as resist application process, pre-bake process, development process, post-bake process, a simulation, in which the shape of patterns are gradually changed, is performed, so that the shape of patterns which are drawn, are made to correspond to the target shape of patterns. Accordingly, the correction error which appears to the patterns locally in the unit drawing area, such as a chip, is solved. However, in the conventional lithography technology, not only the dose of the charged particle beam is changed, but also a change of a whole mask process (resist process) is considered, in order to solve the correction error which appears to the patterns locally in the unit drawing area, such as a chip. Consequently, it is not easy to solve the correction error which appears to the patterns locally in the unit drawing area, such as a chip, in the conventional lithography technology.

In the computer lithography technology which is rapidly developing in recent years, the correction error which appears to the patterns locally in the unit drawing area, such as a chip, can be solved by selecting an optimum condition of mask pattern and optical system, and then, using a computer, and then, correcting mask process (resist process). However, in the computer lithography technology, it is necessary to consider a change of mask process model by considering a whole mask process (resist process), in order to solve the correction error which appears to the patterns locally in the unit drawing area, such as a chip. And large calculation cost is required because calculation time of the computer is enormous. Accordingly, it is not easy to solve the correction error which appears to the patterns locally in the unit drawing area, such as a chip, in the computer lithography technology.

SUMMARY OF THE INVENTION

An object of the present invention is to provide an charged particle beam drawing apparatus and proximity effect correction method thereof, which can easily solve the correction error which appears to the patterns locally in the unit drawing area, such as a chip.

In detail, the object of the present invention is to provide the charged particle beam drawing apparatus and proximity effect correction method thereof, which can easily solve the correction error which appears to the patterns locally in the unit drawing area, such as critical dimension error caused by resist process (mask process), unknown mechanism.

In accordance with one aspect of the present invention, a charged particle beam drawing apparatus, comprising: a drawing portion for drawing patterns corresponding to figures included in a drawing data, in a drawing area of a workpiece, by irradiating the workpiece with a charged particle beam, wherein the workpiece is formed by applying a resist to an upper surface of the workpiece; a proximity effect correcting map forming portion for forming a proximity effect correcting map having meshes, so that the figures included in the drawing data are placed in the proximity effect correcting map; a representative figure forming portion for forming representative figures, wherein area of a representative figure in a mesh is equal to gross area of figures in the mesh; a proximity effect correction dose calculating portion for calculating a proximity effect correction dose of the charged particle beam in each mesh, on the basis of area of each representative figure in each mesh; a figure area changing portion for changing area of at least one figure, before the representative figures are formed by the representative figure forming portion, if it is necessary to change the proximity effect correction dose of the charged particle beam for drawing at least one pattern corresponding to the at least one figure; and a proximity effect correction dose changing portion for changing the proximity effect correction dose of the charged particle beam for drawing the at least one pattern corresponding to the at least one figure, calculated by the proximity effect correction dose calculating portion, if it is necessary to change the proximity effect correction dose of the charged particle beam for drawing the at least one pattern corresponding to the at least one figure is provided.

In accordance with another aspect of the present invention, a proximity effect correction method of a charged particle beam drawing apparatus for drawing patterns corresponding to figures included in a drawing data, in a drawing area of a workpiece, by irradiating the workpiece with a charged particle beam, wherein the workpiece is formed by applying a resist to an upper surface of the workpiece, comprising: forming a proximity effect correcting map having meshes by a proximity effect correcting map forming portion, so that the figures included in the drawing data are placed in the proximity effect correcting map; forming representative figures by a representative figure forming portion, wherein area of a representative figure in a mesh is equal to gross area of figures in the mesh; calculating a proximity effect correction dose of the charged particle beam in each mesh, on the basis of area of each representative figure in each mesh, by a proximity effect correction dose calculating portion; changing area of at least one figure by a figure area changing portion, before the representative figures are formed by the representative figure forming portion, if it is necessary to change the proximity effect correction dose of the charged particle beam for drawing at least one pattern corresponding to the at least one figure; and changing the proximity effect correction dose of the charged particle beam for drawing the at least one pattern corresponding to the at least one figure, calculated by the proximity effect correction dose calculating portion, by a proximity effect correction dose changing portion, if it is necessary to change the proximity effect correction dose of the charged particle beam for drawing the at least one pattern corresponding to the at least one figure is provided.

Other and further objects, features and advantages of the invention will appear more fully from the following description.

BRIEF DESCRIPTION OF THE DRAWINGS

FIG. 1 is a schematic illustration of a first embodiment of a charged particle beam drawing apparatus 10 according to the present invention;

FIG. 2 shows a control computer 10$b$1 of a control portion 10$b$ of the charged particle beam drawing apparatus 10 of the first embodiment shown in FIG. 1, in detail;

FIG. 7 explains the proximity effect correcting process performed by the proximity effect correcting portion 10$b$1$b$ in detail;

FIGS. 10A and 10B show examples in which changing the proximity effect correction dose of the charged particle beam for drawing patterns corresponding to figures included in the drawing data D being necessary or unnecessary is distinguished;

FIGS. 11A, 11B, 11C and 11D show examples in which changing the proximity effect correction dose of the charged particle beam for drawing patterns corresponding to figures included in the drawing data D being necessary or unnecessary is distinguished;

FIGS. 12A and 12B show examples in which changing the proximity effect correction dose of the charged particle beam for drawing patterns corresponding to figures included in the drawing data D being necessary or unnecessary is distinguished;

FIGS. 15A and 15B show examples in which changing the proximity effect correction dose of the charged particle beam for drawing patterns corresponding to figures included in the drawing data D being necessary or unnecessary is distinguished;

FIGS. 17A, 17B, 17C and 17D show an example wherein three chips CP01, CP02, CP03, which have the same size, are placed in the same position in the drawing data D (see FIG. 1).

DETAILED DESCRIPTION OF THE INVENTION

Figure 3A:
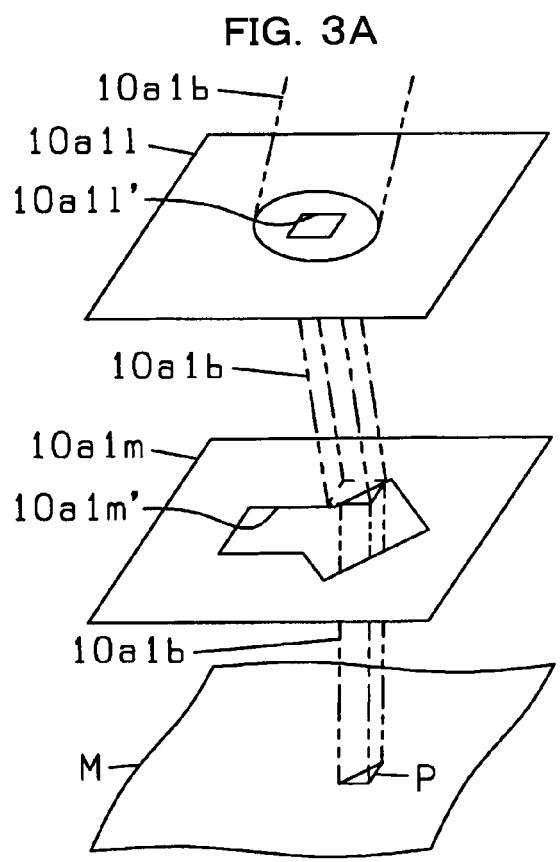
FIGS. 3A, 3B, 3C, 3D, 3E, 3F, 3G, 3H and 3I show examples of a pattern P which can be drawn in the drawing area of the workpiece M by a shot of the charged particle beam 10$a$1$b$ in the charged particle beam drawing apparatus 10 of the first embodiment.

FIG. 1 is a schematic illustration of a first embodiment of a charged particle beam drawing apparatus 10 according to the present invention. FIG. 2 shows a control computer 10b1 of a control portion 10b of the charged particle beam drawing apparatus 10 of the first embodiment shown in FIG. 1, in detail. As shown in FIG. 1, the charged particle beam drawing apparatus 10 of the first embodiment has a drawing portion 10a for drawing patterns in a drawing area of a workpiece M, such as a mask substrate (reticle) and a wafer, by irradiating the workpiece M with a charged particle beam 10a1b, wherein the workpiece M is formed by applying a resist to an upper surface of the workpiece M.

In the charged particle beam drawing apparatus 10 of the first embodiment, an electron beam is used as the charged particle beam 10a1b. In the charged particle beam drawing apparatus 10 of a second embodiment, a charged particle beam such as an ion beam, except the electron beam can be used as the charged particle beam 10a1b.

In the charged particle beam drawing apparatus 10 of the first embodiment, as shown in FIG. 1, the drawing portion 10a has a charged particle beam gun 10a1a, deflectors 10a1c, 10a1d, 10a1e, 10a1f for deflecting the charged particle beam 10a1b emitted from the charged particle beam gun 10a1a, and a movable stage 10a2a for supporting the workpiece M. Patterns are drawn on the workpiece M by the charged particle beam 10a1b deflected by the deflectors 10a1c, 10a1d, 10a1e, 10a1f.

In the charged particle beam drawing apparatus 10 of the first embodiment, as shown in FIG. 1, a drawing chamber 10a2 composes a part of the drawing portion 10a. The movable stage 10a2a for supporting the workpiece M is placed in the drawing chamber 10a2. The stage 10a2a is movable in x axis direction (right and left direction in FIG. 1) and movable in y axis direction (not shown), y axis direction is perpendicular to x axis direction.

In the charged particle beam drawing apparatus 10 of the first embodiment, as shown in FIG. 1, an optical column 10a1 composes a part of the drawing portion 10a. The charged particle beam gun 10a1a, the deflectors 10a1c, 10a1d, 10a1e, 10a1f, lenses 10a1g, 10a1h, 10a1i, 10a1j, 10a1k, a first forming aperture member 10a1l and a second forming aperture member 10a1m are placed in the optical column 10a1.

In detail, in the charged particle beam drawing apparatus 10 of the first embodiment, as shown in FIGS. 1 and 2, a drawing data D inputted to the control computer 10b1 is transferred to a shot dividing portion 10b1a, and a shot dividing process is performed by the shot dividing portion 10b1a. The shot dividing process is explained below in detail. In the charged particle beam drawing apparatus 10 of the first embodiment, the drawing data D inputted to the control computer 10b1 is also transferred to a proximity effect correcting portion 10b1b, and a proximity effect correcting process is performed by the proximity effect correcting portion 10b1b. The proximity effect correcting process is explained below in detail.

Then, in the charged particle beam drawing apparatus 10 of the first embodiment, as shown in FIGS. 1 and 2, shot data for irradiating the workpiece M with the charged particle beam 10a1b is formed by a shot data forming portion 10b1g, on the basis of a result of the shot dividing process of the shot dividing portion 10b1a and a result of the proximity effect correcting process of the proximity effect correcting portion 10b1b, in order to draw patterns in the drawing area of the workpiece M.

Then, in the charged particle beam drawing apparatus 10 of the first embodiment, as shown in FIGS. 1 and 2, the shot data formed by the shot data forming portion 10b1g, is transferred to a deflection control portion 10b1h. Then, the deflectors 10a1c, 10a1d, 10a1e, 10a1f are controlled by the deflection control portion 10b1h on the basis of the shot data. Accordingly, the charged particle beam 10a1b emitted from the charged particle beam gun 10a1a is applied to a predetermined position in the drawing area of the workpiece M.

In detail, in the charged particle beam drawing apparatus 10 of the first embodiment, as shown in FIGS. 1 and 2, the charged particle beam 10a1b emitted from the charged particle beam gun 10a1a is passed through an opening 10a1l' (see FIG. 3A) of the first forming aperture member 10a1l and the workpiece M is irradiated with the charged particle beam 10a1b, or the charged particle beam 10a1b emitted from the charged particle beam gun 10a1a is interrupted by a part of the first forming aperture member 10a1l except the opening 10a1l' and the workpiece M is not irradiated with the charged particle beam 10a1b, by controlling a blanking deflector 10a1c via a deflection control circuit 10b2 by means of the deflection control portion 10b1h on the basis of the shot data formed by the shot data forming portion 10b1g. In other words, in the charged particle beam drawing apparatus 10 of the first embodiment, dose (beam irradiate time) of the charged particle beam 10a1b can be controlled by controlling the blanking deflector 10a1c.

In the charged particle beam drawing apparatus 10 of the first embodiment, as shown in FIGS. 1 and 2, a beam size changing deflector 10a1d is controlled via a deflection control circuit 10b3 by the deflection control portion 10b1h on the basis of the shot data formed by the shot data forming portion 10b1g, so that the charged particle beam 10a1b passed through the opening 10a1l' (see FIG. 3A) of the first forming aperture member 10a1l is deflected by the beam size changing deflector 10a1d. And then, a part of the charged particle beam 10a1b deflected by the beam size changing deflector 10a1d is passed through an opening 10a1m' (see FIG. 3A) of the second forming aperture member 10a1m. In other words, in the charged particle beam drawing apparatus 10 of the first embodiment, size or shape of the charged particle beam 10a1b applied to the drawing area of the workpiece M can be adjusted by adjusting deflecting amount or deflecting direction of the charged particle beam 10a1b deflected by the beam size changing deflector 10a1d.

FIGS. 3A, 3B, 3C, 3D, 3E, 3F, 3G, 3H and 3I show examples of a pattern P which can be drawn in the drawing area of the workpiece M by a shot of the charged particle beam 10a1b in the charged particle beam drawing apparatus 10 of the first embodiment. In the charged particle beam drawing apparatus 10 of the first embodiment, as shown in FIGS. 1 and 3A, when the pattern P (see FIG. 3A) is drawn in the drawing area of the workpiece M by the charged particle beam 10*a*1*b*, a part of the charged particle beam 10*a*1*b* emitted from the charged particle beam gun 10*a*1*a* (see FIG. 1) is passed through the square opening 10*a*1*l'* (see FIG. 3A) of the first forming aperture member 10*a*1*l*. So that, a horizontal sectional shape of the charged particle beam 10*a*1*b* passed through the opening 10*a*1*l'* of the first forming aperture member 10*a*1*l* is almost square. And then, a part of the charged particle beam 10*a*1*b* passed through the opening 10*a*1*l'* of the first forming aperture member 10*a*1*l* is passed through the opening 10*a*1*m'* (see FIG. 3A) of the second forming aperture member 10*a*1*m*.

In the charged particle beam drawing apparatus 10 of the first embodiment, as shown in FIGS. 1 and 3A, a horizontal sectional shape of the charged particle beam 10*a*1*b* passed through the opening 10*a*1*m'* (see FIG. 3A) of the second forming aperture member 10*a*1*m* can be rectangular (square or oblong) or triangular, by deflecting the charged particle beam 10*a*1*b* passed through the opening 10*a*1*l'* (see FIG. 3A) of the first forming aperture member 10*a*1*l* by means of the deflector 10*a*1*d* (see FIG. 1).

In the charged particle beam drawing apparatus 10 of the first embodiment, as shown in FIGS. 1 and 3A, the pattern P (see FIG. 3A) having the same shape as the horizontal sectional shape of the charged particle beam 10*a*1*b* passed through the opening 10*a*1*m'* (see FIG. 3A) of the second forming aperture member 10*a*1*m* can be drawn in the drawing area of the workpiece M, by applying the charged particle beam 10*a*1*b* passed through the opening 10*a*1*m'* (see FIG. 3A) of the second forming aperture member 10*a*1*m*, to a predetermined position in the drawing area of the workpiece M, for a predetermined time.

In the charged particle beam drawing apparatus 10 of the first embodiment, as shown in FIGS. 1 and 3A, a rectangular (square or oblong) pattern P (see FIGS. 3B, 3C, 3D and 3E) or a triangular pattern P (see FIGS. 3F, 3G, 3H and 3I) can be drawn in the drawing area of the workpiece M by a shot of the charged particle beam 10*a*1*b*, by means of controlling deflecting amount and deflecting direction of the charged particle beam 10*a*1*b* passed through the opening 10*a*1*l'* (see FIG. 3A) of the first forming aperture member 10*a*1*l* and then deflected by the deflector 10*a*1*d* (see FIG. 1).

In the charged particle beam drawing apparatus 10 of the first embodiment, as shown in FIGS. 1 and 2, a main deflector 10*a*1*e* is controlled via a deflection control circuit 10*b*4 by the deflection control portion 10*b*1*h* on the basis of the shot data formed by the shot data forming portion 10*b*1*h*, so that the charged particle beam 10*a*1*b* passed through the opening 10*a*1*m'* (see FIG. 3A) of the second forming aperture member 10*a*1*m* is deflected by the main deflector 10*a*1*e*.

In the charged particle beam drawing apparatus 10 of the first embodiment, as shown in FIGS. 1 and 2, a sub-deflector 10*a*1*f* is controlled via a deflection control circuit 10*b*5 by the deflection control portion 10*b*1*h* on the basis of the shot data formed by the shot data forming portion 10*b*1*h*, so that the charged particle beam 10*a*1*b* deflected by the main deflector 10*a*1*e* is deflected by the sub-deflector 10*a*1*f*. In the charged particle beam drawing apparatus 10 of the first embodiment, the irradiate position of the charged particle beam 10*a*1*b* in the drawing area of the workpiece M can be adjusted by adjusting deflecting amount and deflecting direction of the charged particle beam 10*a*1*b* by means of the main deflector 10*a*1*e* and the sub-deflector 10*a*1*f*.

In the charged particle beam drawing apparatus 10 of the first embodiment, as shown in FIGS. 1 and 2, movement of the movable stage 10*a*2*a* is controlled via a stage control circuit 10*b*6 by a stage control portion 10*b*1*i* on the basis of the shot data formed by the shot data forming portion 10*b*1*h*.

In the example shown in FIGS. 1 and 2, a layout data (CAD data, design data) prepared by a designer such as a semiconductor integrated circuit designer, is converted into the drawing data D of the format of the charged particle beam drawing apparatus 10. And then, the drawing data D is inputted to the control computer 10*b*1 of the charged particle beam drawing apparatus 10. In general, a plurality of small patterns are included in the layout data (CAD data, design data), so that the amount of the layout data (CAD data, design data) is very large. In general, after the layout data (CAD data, design data) is converted into a different format data, the amount of the data increases. Therefore, in order to compress the amount of the layout data (CAD data, design data) and the drawing data D, the layout data (CAD data, design data) and the drawing data D have hierarchical structure.

Figure 4:
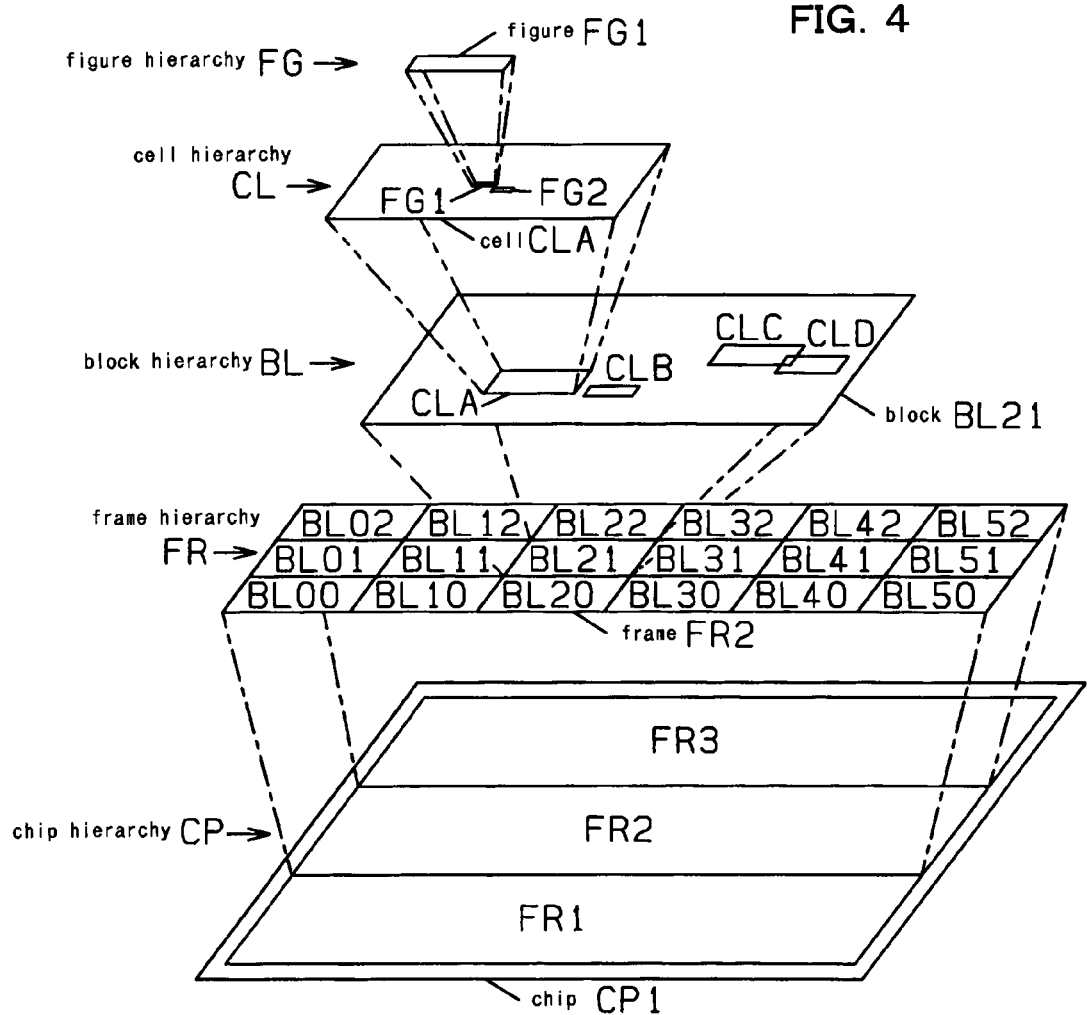
FIG. 4 shows an example of the drawing data D shown in FIGS. 1 and 2.

FIG. 4 shows an example of the drawing data D shown in FIGS. 1 and 2. In the example shown in FIG. 4, the drawing data D (see FIGS. 1 and 2) applied to the charged particle beam drawing apparatus 10 of the first embodiment, has a chip hierarchy CP, a frame hierarchy FR which is lower than the chip hierarchy CP, a block hierarchy BL which is lower than the frame hierarchy FR, a cell hierarchy CL which is lower than the frame hierarchy FR, and a figure hierarchy FG which is lower than the cell hierarchy CL.

In the example shown in FIG. 4, a chip CP1 is one of elements of the chip hierarchy CP, and corresponds to three frames FR1, FR2, FR3. The frame FR2 is one of elements of the frame hierarchy FR, and corresponds to eighteen blocks BL00, BL10, BL20, BL30, BL40, BL50, BL01, BL11, BL21, BL31, BL41, BL51, BL02, BL12, BL22, BL32, BL42, BL52. The block BL21 is one of elements of the block hierarchy BL, and corresponds to cells CLA, CLB, CLC, CLD. The cell CLA is one of elements of the cell hierarchy CL, and corresponds to a plurality of figures FG1, FG2. Each of the figures FG1, FG2 is one of elements of the figure hierarchy FG.

In the charged particle beam drawing apparatus 10 of the first embodiment, as shown in FIGS. 1, 2 and 4, the charged particle beam 10*a*1*b* (see FIG. 1) draws patterns in the drawing area of the workpiece M (see FIG. 1), and the patterns correspond to the plurality of figures FG1, FG2 (see FIG. 4) in the figure hierarchy FG (see FIG. 4) in the drawing data D (see FIGS. 1 and 2).

FIGS. 5A, 5B, 5C, 5D, 5E, 5F, 5G, 5H and 5I show an example of sequence of drawing of the pattern P1 corresponding to the figure FG1 included in the drawing data D by means of the charged particle beam 10*a*1*b*. In detail, FIGS. 5A, 5B, 5C, 5D, 5E, 5F, 5G, 5H and 5I explain the example of the number of the shots of the charged particle beam 10*a*1*b* for drawing the pattern P1 corresponding to the figure FG1 included in the drawing data D, in the drawing area of the workpiece M, in the charged particle beam drawing apparatus 10 of the first embodiment.

Figure 3B:
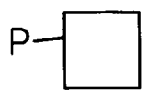
Figure 3F:
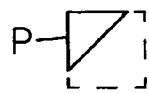
Figure 3C:
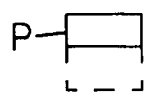
Figure 3G:
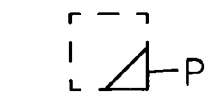
Figure 3D:
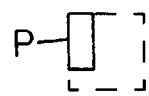
Figure 3H:
Figure 3E:
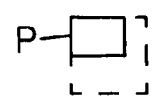
Figure 3I:
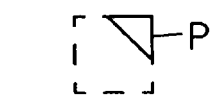

In the charged particle beam drawing apparatus 10 of the first embodiment, as shown in FIGS. 5A, 5B, 5C, 5D, 5E, 5F, 5G, 5H and 5I, more than one shots of the charged particle beam 10*a*1*b* (see FIG. 3A) is performed, if the pattern P1 (see FIG. 5I) corresponding to the figure FG1 (see FIG. 4) included in the drawing data D (see FIGS. 1 and 2) is larger than the largest pattern P (see FIG. 3B). In other words, in the charged particle beam drawing apparatus 10 of the first embodiment, if the pattern P1 (see FIG. 5I) corresponding to the figure FG1 (see FIG. 4) included in the drawing data D (see FIGS. 1 and 2) is larger than the largest pattern P (see FIG. 3B), the shot dividing portion 10*b*1*a* (see FIG. 2) divides the figure FG1 (see FIG. 4) included in the drawing data D (see FIGS. 1 and 2) into small figures (not shown) in the drawing data D, the small figures corresponding to patterns P1a, P1b, P1c, P1d, P1e, P1f, P1g, P1h and P1i (see FIGS. 5A, 5B, 5C, 5D, 5E, 5F, 5G, 5H and 5I). Namely, the shot dividing portion 10b1a (see FIG. 2) performs the shot dividing process. Then, the shot data is formed by the shot data forming portion 10b1g (see FIG. 2), on the basis of the result of the shot dividing process of the shot dividing portion 10b1a.

Figure 5A:
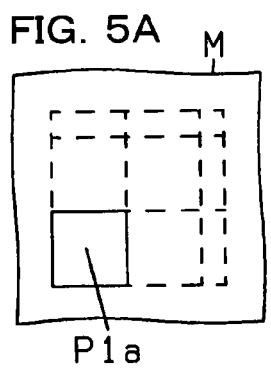
FIGS. 5A, 5B, 5C, 5D, 5E, 5F, 5G, 5H and 5I show an example of sequence of drawing of the pattern P1 corresponding to the figure FG1 included in the drawing data D by means of the charged particle beam 10$a$1$b$.
Figure 5B:
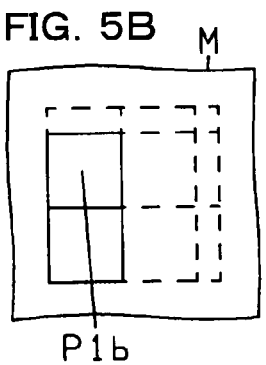
Figure 5C:
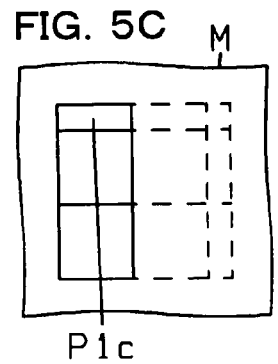
Figure 5D:
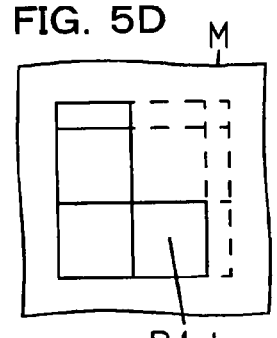
Figure 5E:
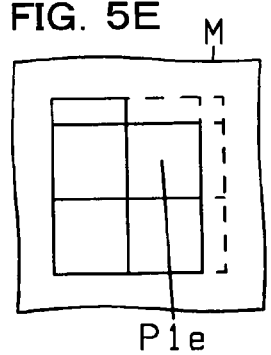
Figure 5F:
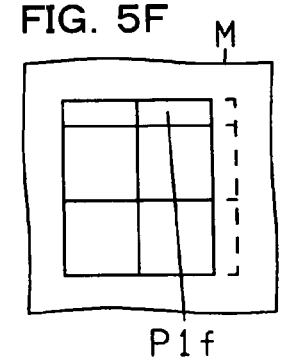
Figure 5G:
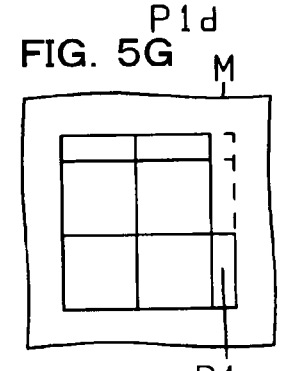
Figure 5H:
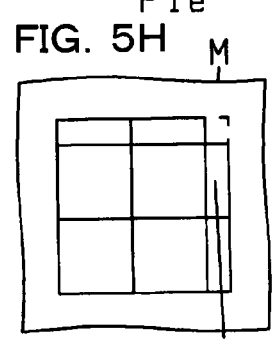
Figure 5I:
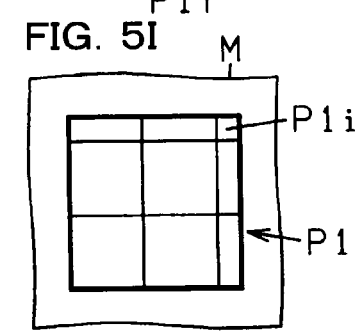

In the example shown in FIGS. 5A, 5B, 5C, 5D, 5E, 5F, 5G, 5H and 5I, as shown in FIG. 5A, a pattern P1a which has the same shape as the largest pattern P (see FIG. 3B) is drawn in the drawing area of the workpiece M by a first shot of the charged particle beam 10a1b (see FIG. 3A).

Then, in the example shown in FIGS. 5A, 5B, 5C, 5D, 5E, 5F, 5G, 5H and 5I, a pattern P1b (see FIG. 5B) is drawn in the drawing area of the workpiece M by a second shot of the charged particle beam 10a1b (see FIG. 3A). Then, a pattern P1c (see FIG. 5C) is drawn in the drawing area of the workpiece M by a third shot of the charged particle beam 10a1b (see FIG. 3A). Then, a pattern P1d (see FIG. 5D) is drawn in the drawing area of the workpiece M by a forth shot of the charged particle beam 10a1b (see FIG. 3A). Then, a pattern P1e (see FIG. 5E) is drawn in the drawing area of the workpiece M by a fifth shot of the charged particle beam 10a1b (see FIG. 3A). Then, a pattern P1f (see FIG. 5F) is drawn in the drawing area of the workpiece M by a sixth shot of the charged particle beam 10a1b (see FIG. 3A). Then, a pattern P1g (see FIG. 5G) is drawn in the drawing area of the workpiece M by a seventh shot of the charged particle beam 10a1b (see FIG. 3A). Then, a pattern P1h (see FIG. 5H) is drawn in the drawing area of the workpiece M by an eighth shot of the charged particle beam 10a1b (see FIG. 3A). Then, a pattern P1i (see FIG. 5I) is drawn in the drawing area of the workpiece M by a ninth shot of the charged particle beam 10a1b (see FIG. 3A).

Accordingly, in the example shown in FIGS. 5A, 5B, 5C, 5D, 5E, 5F, 5G, 5H and 5I, the pattern P1 corresponding to the figure FG1 (see FIG. 4) included in the drawing data D (see FIGS. 1 and 2) is drawn in the drawing area of the workpiece M.

In the example shown in FIGS. 5A, 5B, 5C, 5D, 5E, 5F, 5G, 5H and 5I, in order to explain that nine times shots of the charged particle beam 10a1b (see FIG. 3A) are necessary to draw the pattern P1 in the drawing area of the workpiece M, and that four times shots of the charged particle beam 10a1b (see FIG. 3A) for drawing the patterns P1a, P1b, P1d, P1e which respectively has the same shape as the largest pattern P (see FIG. 3B) are not enough to draw the pattern P1 in the drawing area of the workpiece M, shots of the charged particle beam 10a1b are divided into four times shots of the charged particle beam 10a1b for drawing the patterns P1a, P1b, P1d, P1e which respectively have the same shape as the largest pattern P (see FIG. 3B), and five times shots of the charged particle beam 10a1b for drawing the patterns P1c, P1f, P1g, P1h, P1i which are respectively smaller than the largest pattern P (see FIG. 3B). Actually, in the charged particle beam drawing apparatus 10 of the first embodiment, the shot dividing process is performed, so that drawing of a small pattern, such as the pattern P1i (see FIG. 5I), is avoided. Namely, if the pattern P1 (see FIG. 5I) is drawn by nine times shots of the charged particle beam 10a1b (see FIG. 3A), the pattern P1 is equally divided into nine patterns, the nine patterns are arranged in three rows extending in X axis direction (right and left direction in FIG. 5I) of three, and each pattern is drawn by one shot of the charged particle beam 10a1b (see FIG. 3A).

FIGS. 6, 7, and 9 explain the proximity effect correcting process performed by the proximity effect correcting portion 10b1b (see FIG. 2) in detail, the proximity effect correcting portion 10b1b is a characteristic part of the charged particle beam drawing apparatus 10 of the first embodiment. In the charged particle beam drawing apparatus 10 of the first embodiment, the proximity effect correcting portion 10b1b (see FIG. 2) is composed, so that the correction error, which appears to the patterns locally in the unit drawing area, such as a chip CP1 (see FIG. 4), can be solved. In the charged particle beam drawing apparatus 10 of the first embodiment, if the correction error does not appear to the patterns locally in the unit drawing area, such as the chip CP1 (see FIG. 4), the relation shown in the equation (1) is used, the proximity effect correcting process is performed in the same way as in the typical charged particle beam drawing apparatus in the prior art, such as the charged particle beam drawing apparatus described in Japanese Unexamined Patent Publication No. 2003-318077.

Figure 6A:
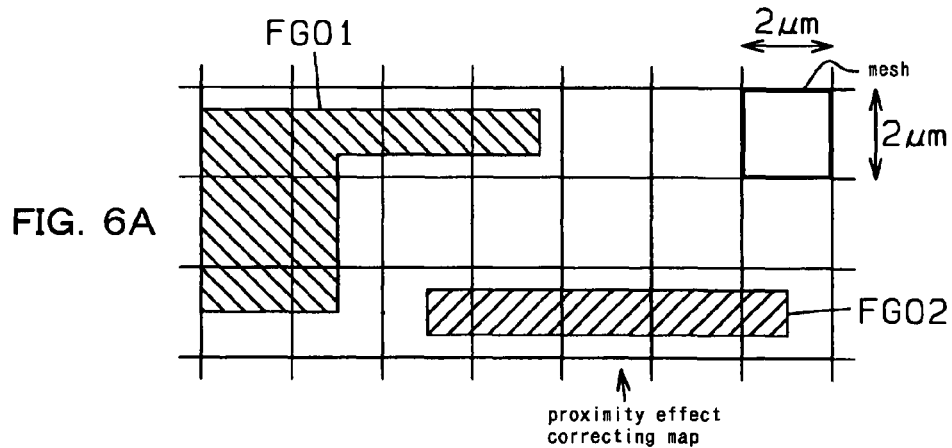
FIG. 6 explains the proximity effect correcting process performed by the proximity effect correcting portion 10$b$1$b$ in detail.

In the charged particle beam drawing apparatus 10 of the first embodiment, if the drawing data D (see FIG. 2) inputted to the control computer 10b1 (see FIG. 2) includes figures FG01, FG02 (see FIG. 6A), a proximity effect correcting map (see FIG. 6A) having meshes (see FIG. 6A) is formed by a proximity effect correcting map forming portion 10b1b1 (see FIG. 2), for example, the size of each mesh being 2 μm×2 μm (see FIG. 6A), so that the figures FG01, FG02 (see FIG. 6A) are placed in the proximity effect correcting map (see FIG. 6A).

Figure 6B:
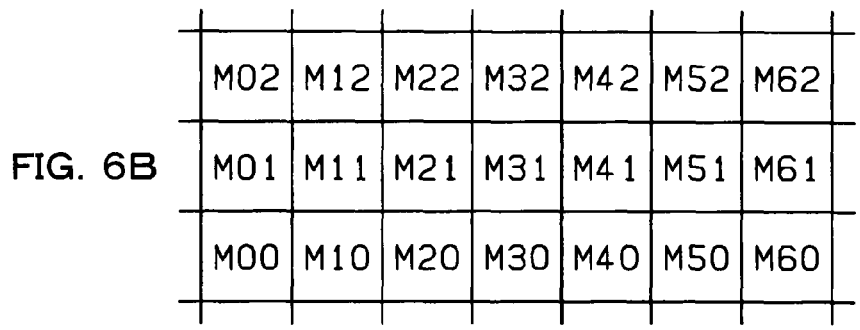

Then, in the charged particle beam drawing apparatus 10 of the first embodiment, representative figures f00, f10, f20, f30, f40, f50, f60, f01, f11, f02, f12, f22, f32 (see FIG. 6C) are formed by a representative figure forming portion 10b1b2 (see FIG. 2), wherein area of each representative figure f00, f10, f20, f30, f40, f50, f60, f01, f11, f02, f12, f22, f32 (see FIG. 6C) is equal to gross area of figures FG01, FG02 (see FIG. 6A) placed in each mesh M00, M10, M20, M30, M40, M50, M60, M01, M11, M02, M12, f22, f32 (see FIG. 6B). Namely, in the example shown in FIGS. 6A, 6B and 6C, area of the representative figure f00 (see FIG. 6C) in the mesh M00 (see FIG. 6B) is equal to gross area of a part of the figure FG01 (see FIG. 6A) placed in the mesh M00 (see FIG. 6B), area of the representative figure f20 (see FIG. 6C) in the mesh M20 (see FIG. 6B) is equal to gross area of a part of the figure FG02 (see FIG. 6A) placed in the mesh M20 (see FIG. 6B).

Figure 6C:
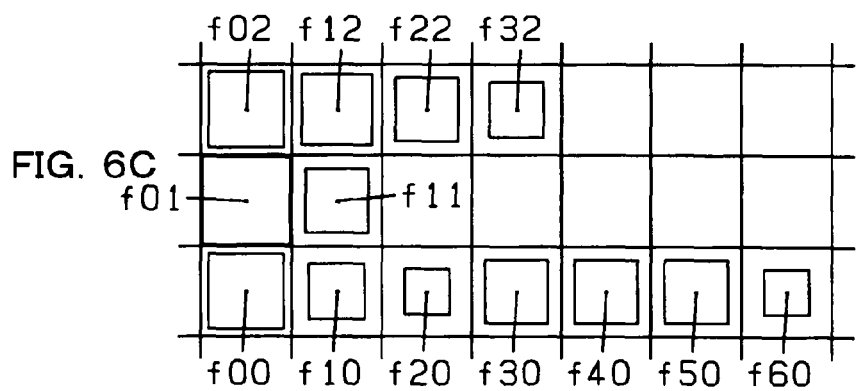

In the example shown in FIGS. 6A, 6B and 6C, the center of gravity of each representative figure f00, f10, f20, f30, f40, f50, f60, f01, f11, f02, f12, f22, f32 (see FIG. 6C) is placed in the center of each mesh M00, M10, M20, M30, M40, M50, M60, M01, M11, M02, M12, f22, f32 (see FIG. 6B) in order to simplify the calculation. In another example (not shown) in which rigorous calculation is required, the center of gravity of each representative figure f00, f10, f20, f30, f40, f50, f60, f01, f11, f02, f12, f22, f32 (see FIG. 6C) is not placed in the center of each mesh M00, M10, M20, M30, M40, M50, M60, M01, M11, M02, M12, f22, f32 (see FIG. 6B). But, the center of gravity of the representative figure f00 (see FIG. 6C) is made to correspond to the center of gravity of the part of the figure FG01 (see FIG. 6A) placed in the mesh M00 (see FIG. 6B), and the center of gravity of the representative figure f20 (see FIG. 6C) is made to correspond to the center of gravity of the part of the figure FG02 (see FIG. 6A) placed in the mesh M20 (see FIG. 6B), for example.

Then, in the charged particle beam drawing apparatus 10 of the first embodiment, a proximity effect correction dose D00, D10, D20, D30, D40, D50, D60, D01, D11, D02, D12, D22, D32 (see FIG. 6D) of the charged particle beam in each mesh M00, M10, M20, M30, M40, M50, M60, M01, M11, M02, M12, f22, f32 (see FIG. 6B) is calculated by a proximity effect correction dose calculating portion 10b1b3 (see FIG.

2), on the basis of area of each representative figure f00, f10, f20, f30, f40, f50, f60, f01, f11, f02, f12, f22, f32 (see FIG. 6C) in each mesh M00, M10, M20, M30, M40, M50, M60, M01, M11, M02, M12, f22, f32 (see FIG. 6B).

In the example shown in FIGS. 6A, 6B, 6C and 6D, area of the representative figure f01 (see FIG. 6C) in the mesh M01 (see FIG. 6B) is large, so that dose of the charged particle beam 10a1b (see FIG. 1) for drawing a pattern corresponding to a part of the figure FG01 (see FIG. 6A) in the mesh M01 (see FIG. 6B) is large. Consequently, influence of backscattering (right portion of the left side of the equation (1)) on figures, such as the figure FG02 (see FIG. 6A), in surrounding meshes, such as the mesh M20 (see FIG. 6B), is large. Area of the representative figure f60 (see FIG. 6C) in the mesh M60 (see FIG. 6B) is small, so that dose of the charged particle beam 10a1b (see FIG. 1) for drawing a pattern corresponding to a part of the figure FG02 (see FIG. 6A) in the mesh M60 (see FIG. 6B) is small. Consequently, influence of backscattering (right portion of the left side of the equation (1)) on figures (not shown) in surrounding meshes (not shown) is small.

In detail, in the example shown in FIGS. 6A, 6B, 6C and 6D, the proximity effect correction dose D00, D10, D20, D30, D40, D50, D60, D01, D11, D02, D12, D22, D32 (see FIG. 6D) of the charged particle beam in each mesh M00, M10, M20, M30, M40, M50, M60, M01, M11, M02, M12, M22, M32 (see FIG. 6B) is calculated by solving the proximity effect correction equations (2) to (8).

Concretely, in the example shown in FIGS. 6A, 6B, 6C and 6D, sum $(d_0(x)+d_1(x)+d_2(x))$ of dose $d_0(x)$ (n=0) (see equation (4)) corresponding to a first term, dose $d_1(x)$ (n=1) (see equation (6)) corresponding to a second term, and dose $d_2(x)$ (n=2) (see equation (6)) corresponding to a third term, is used as the proximity effect correction dose D(x) (see equation (3)) of the charged particle beam, in the same way as in an example shown in paragraphs 0104 to 0109 of Japanese Unexamined Patent Publication No. 2003-318077.

In other words, in the charged particle beam drawing apparatus 10 of the first embodiment, if the correction error does not appear to the patterns locally in the unit drawing area, such as the chip CP1 (see FIG. 4), the proximity effect correction dose D00, D10, D20, D30, D40, D50, D60, D01, D11, D21, D31, D41, D51, D61, D02, D12, D22, D32, D42, D52, D62 (see FIG. 6D) of the charged particle beam in each mesh M00, M10, M20, M30, M40, M50, M60, M01, M11, M21, M31, M41, M51, M61, M02, M12, M22, M32, M42, M52, M62 (see FIG. 6B) is calculated by solving the proximity effect correction equations (2) to (8) under the condition that the sum (the right side of the equation (1)) of the accumulation energy of the charged particle beam accumulated by forward-scattering (the left portion of the left side of the equation (1)) and the accumulation energy of the charged particle beam accumulated by backscattering (the right portion of the left side of the equation (1)) is a constant $E_0$ in a unit drawing area, such as a chip CP1 (see FIG. 4), in the same way as in the typical charged particle beam drawing apparatus in the prior art, such as the charged particle beam drawing apparatus described in Japanese Unexamined Patent Publication No. 2003-318077.

In the charged particle beam drawing apparatus 10 of the first embodiment, in the example shown in FIGS. 6A and 7, the figure FG01 (see FIG. 6A) is divided into twenty small shot figures S01a, S01b, S01c (see FIG. 7) by the shot dividing portion 10b1a (see FIG. 2), the figure FG02 (see FIG. 6A) is divided into eight small shot figures S02a, S02b, S02c, S02d, S02e, S02f, S02g, S02h (see FIG. 7) by the shot dividing portion 10b1a (see FIG. 2).

Figure 6D:
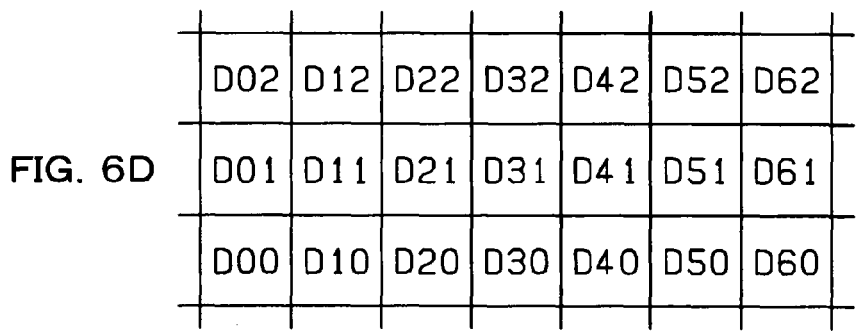

In detail, in the example shown in FIGS. 6B, 6D and 7, the center of gravity of the shot figure S01a (see FIG. 7) and the center of gravity of the shot figure S01b (see FIG. 7) are placed in the mesh M00 (see FIG. 6B), so that the proximity effect correction dose of the charged particle beam for drawing patterns corresponding to the shot figures S01a, S01b (see FIG. 7) is D00 (see FIG. 6D). The center of gravity of the shot figure S01c (see FIG. 7) is placed in the mesh M10 (see FIG. 6B), so that the proximity effect correction dose of the charged particle beam for drawing a pattern corresponding to the shot figure S01c (see FIG. 7) is D10 (see FIG. 6D). The center of gravity of the shot figure S02a (see FIG. 7) is placed in the mesh M20 (see FIG. 6B), so that the proximity effect correction dose of the charged particle beam for drawing a pattern corresponding to the shot figure S02a (see FIG. 7) is D20 (see FIG. 6D). The center of gravity of the shot figure S02b (see FIG. 7) and the center of gravity of the shot figure S02c (see FIG. 7) are placed in the mesh M30 (see FIG. 6B), so that the proximity effect correction dose of the charged particle beam for drawing patterns corresponding to the shot figures S02b, S02c (see FIG. 7) is D30 (see FIG. 6D). The center of gravity of the shot figure S02d (see FIG. 7) and the center of gravity of the shot figure S02e (see FIG. 7) are placed in the mesh M40 (see FIG. 6B), so that the proximity effect correction dose of the charged particle beam for drawing patterns corresponding to the shot figures S02d, S02e (see FIG. 7) is D40 (see FIG. 6D). The center of gravity of the shot figure S02f (see FIG. 7) and the center of gravity of the shot figure S02g (see FIG. 7) are placed in the mesh M50 (see FIG. 6B), so that the proximity effect correction dose of the charged particle beam for drawing patterns corresponding to the shot figures S02f, S02g (see FIG. 7) is D50 (see FIG. 6D). The center of gravity of the shot figure S02h (see FIG. 7) is placed in the mesh M60 (see FIG. 6B), so that the proximity effect correction dose of the charged particle beam for drawing a pattern corresponding to the shot figure S02h (see FIG. 7) is D60 (see FIG. 6D).

Figure 8A:
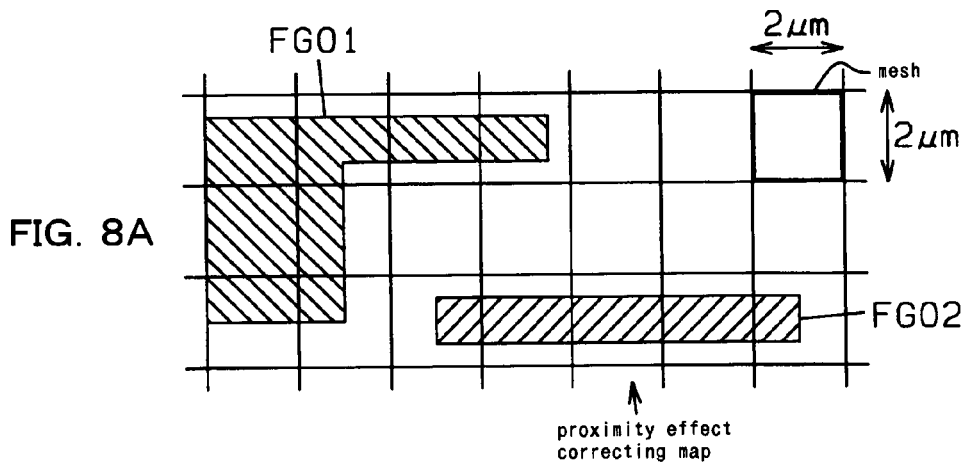
FIGS. 8A, 8B and 8C explain the proximity effect correcting process performed by the proximity effect correcting portion 10$b$1$b$ in detail.
Figure 8B:
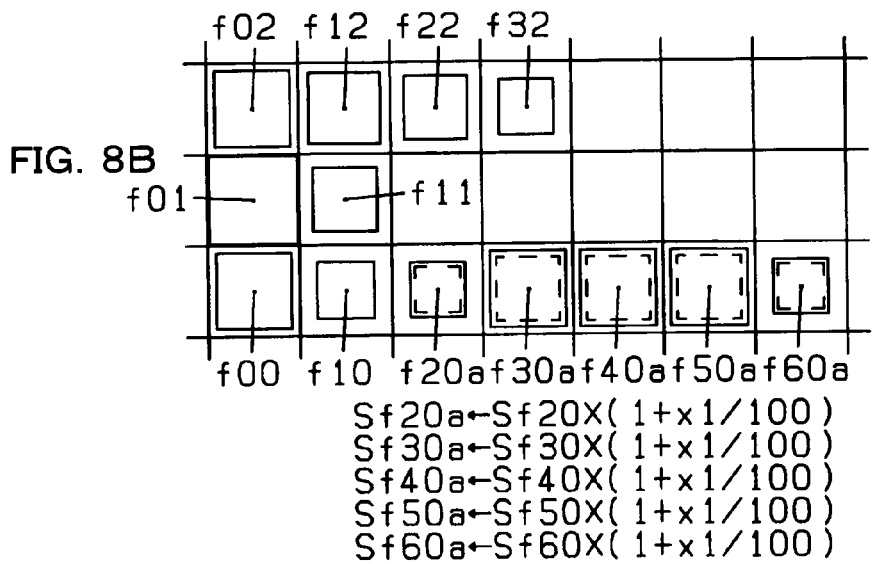
Figure 8C:
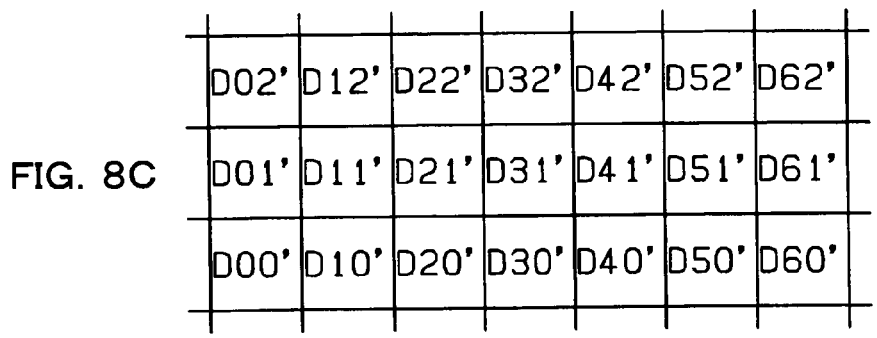
Figure 9A:
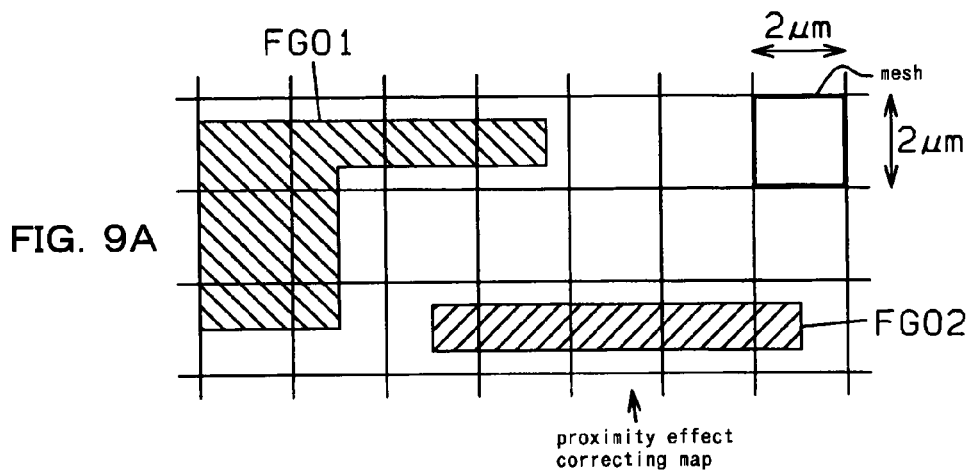
FIGS. 9A, 9B and 9C explain the proximity effect correcting process performed by the proximity effect correcting portion 10$b$1$b$ in detail.
Figure 9B:
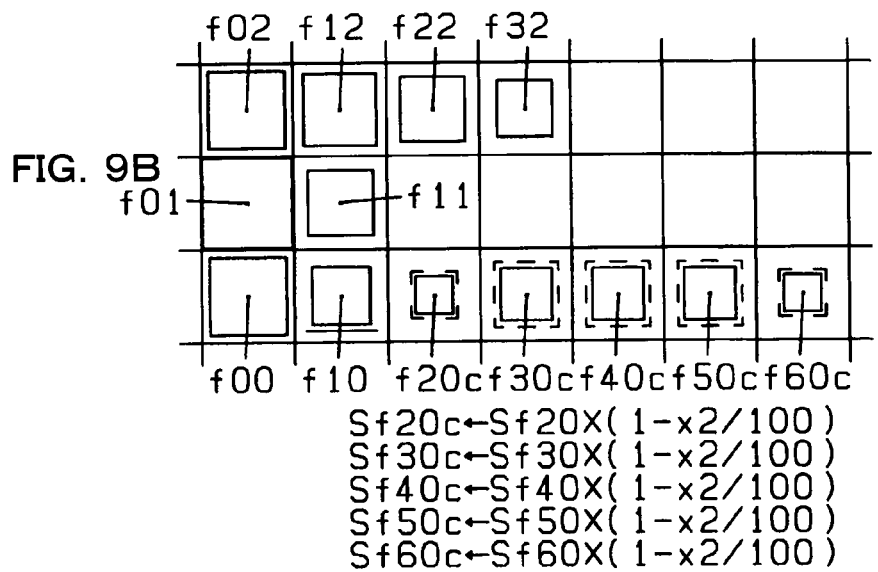
Figure 9C:
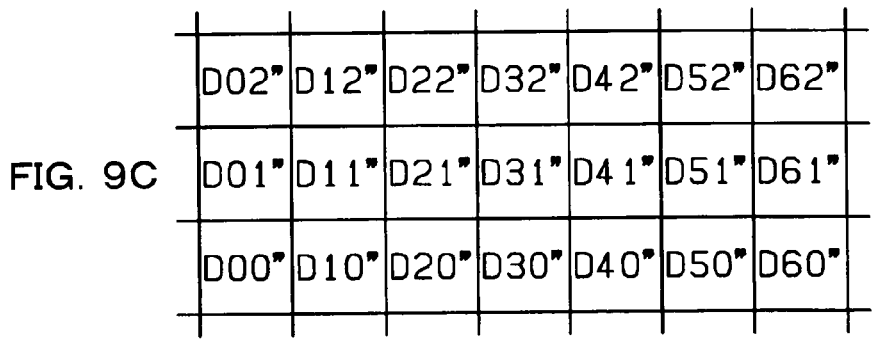

FIGS. 8A, 8B and 8C show an example of a correction error which appears to the patterns locally in the unit drawing area, such as a chip CP1 (see FIG. 4). In the example shown in FIGS. 8A, 8B and 8C, the actual width of the linear pattern corresponding to the figure FG02 (see FIG. 8A) is smaller than the target width of the linear pattern. FIGS. 9A, 9B and 9C show another example of a correction error which appears to the patterns locally in the unit drawing area, such as a chip CP1 (see FIG. 4). In the example shown in FIGS. 9A, 9B and 9C, the actual width of the linear pattern corresponding to the figure FG02 (see FIG. 9A) is larger than the target width of the linear pattern. In the charged particle beam drawing apparatus 10 of the first embodiment, if a correction error appears to the patterns locally in the unit drawing area, such as the chip CP1 (see FIG. 4), a relation shown in a following equation (9) is used, and the proximity effect correcting process is performed.

$$\frac{D(x)}{2} + \eta \int\int_{pattern} D(x')g(x-x')dx' = \underbrace{E_0}_{\substack{constant \\ term}} + \underbrace{\Delta E(x)}_{\substack{additional \\ term}}$$

In the charged particle beam drawing apparatus 10 of the first embodiment, if the correction error appears to the patterns locally in the unit drawing area, such as the chip CP1 (see FIG. 4), the proximity effect correction dose D00', D10', D20', D30', D40', D50', D60', D01', D11', D21', D31', D41', D51', D61', D02', D12', D22', D32', D42', D52', D62', D00", D10", D20", D30", D40", D50", D60", D01", D11", D21", D31", D41", D51", D61", D02", D12", D22", D32", D42", D52", D62" (see FIGS. 8C and 9C) of the charged particle beam in each mesh M00, M10, M20, M30, M40, M50, M60, M01, M11, M21, M31, M41, M51, M61, M02, M12, M22, M32, M42, M52, M62 (see FIG. 6B) is calculated by solving the proximity effect correction equations (2) to (8) under the condition that the sum (the right side of the equation (9)) of the accumulation energy of the charged particle beam accumulated by forward-scattering (the left portion of the left side of the equation (9)) and the accumulation energy of the charged particle beam accumulated by backscattering (the right portion of the left side of the equation (9)) is not equal to the constant $E_0$ (constant term in the right side of the equation (9)) in a unit drawing area, such as a chip CP1 (see FIG. 4), of the workpiece M (see FIG. 1).

In detail, in the charged particle beam drawing apparatus 10 of the first embodiment, if a correction error appears to the patterns locally in the unit drawing area, such as the chip CP1 (see FIG. 4), and the actual width of the linear pattern corresponding to the figure FG02 (see FIG. 8A) is smaller than the target width of the linear pattern, a proximity effect correcting map (see FIG. 8A) having meshes (see FIG. 8A) is formed by the proximity effect correcting map forming portion 10$b$1$b$1 (see FIG. 2), for example, the size of each mesh being 2 μm×2 μm (see FIG. 8A), so that the figures FG01, FG02 (see FIG. 8A) are placed in the proximity effect correcting map (see FIG. 8A).

Then, in the charged particle beam drawing apparatus 10 of the first embodiment, before representative figures f20, f30, f40, f50, f60 (see FIG. 6C) are formed by the representative figure forming portion 10$b$1$b$2 (see FIG. 2), the area of the figure FG02 (see FIG. 8A) is changed by a figure area changing portion 10$b$1$b$2$a$ (see FIG. 2), so that the area of the figure FG02 (see FIG. 8A) increases, namely, the figure FG02 (see FIG. 8A) is enlarged, wherein it is necessary to change the proximity effect correction dose of the charged particle beam for drawing patterns corresponding to the figure FG02 (see FIG. 8A).

Then, in the charged particle beam drawing apparatus 10 of the first embodiment, representative figures f00, f10, f01, f11, f02, f12, f22, f32 (see FIG. 8B) are formed by the representative figure forming portion 10$b$1$b$2 (see FIG. 2), wherein area of each representative figure f00, f10, f01, f11, f02, f12, f22, f32 (see FIG. 8B) is equal to gross area of the figure FG01 (see FIG. 8A) placed in each mesh M00, M10, M01, M11, M02, M12, f22, f32 (see FIG. 6B). And representative figures f20$a$, f30$a$, f40$a$, f50$a$, f60$a$ (see FIG. 8B) are formed by the representative figure forming portion 10$b$1$b$2 (see FIG. 2), wherein area of each representative figure f20$a$, f30$a$, f40$a$, f50$a$, f60$a$ (see FIG. 8B) is equal to gross area of enlarged figure FG02 (not shown) placed in each mesh M20, M30, M40, M50, M60 (see FIG. 6B).

In detail, in the example shown in FIGS. 8A, 8B and 8C, the area Sf20$a$ (see FIG. 8B) of representative figure f20$a$ (see FIG. 8B) is x1 percent larger than the area Sf20 (see FIG. 8B) of representative figure f20 (see FIG. 6C) (Sf20$a$=Sf20×(1+x1/100)). The area Sf30$a$ (see FIG. 8B) of representative figure f30$a$ (see FIG. 8B) is x1 percent larger than the area Sf30 (see FIG. 8B) of representative figure f30 (see FIG. 6C) (Sf30$a$=Sf30×(1+x1/100)). The area Sf40$a$ (see FIG. 8B) of representative figure f40$a$ (see FIG. 8B) is x1 percent larger than the area Sf40 (see FIG. 8B) of representative figure f40 (see FIG. 6C) (Sf40$a$=Sf40×(1+x1/100)). The area Sf50$a$ (see FIG. 8B) of representative figure f50$a$ (see FIG. 8B) is x1 percent larger than the area Sf50 (see FIG. 8B) of representative figure f50 (see FIG. 6C) (Sf50$a$=Sf50×(1+x1/100)). The area Sf60$a$ (see FIG. 8B) of representative figure f60$a$ (see FIG. 8B) is x1 percent larger than the area Sf60 (see FIG. 6C) (Sf60$a$=Sf60×(1+x1/100)).

Then, in the charged particle beam drawing apparatus 10 of the first embodiment, proximity effect correction dose D00', D10', D01', D11', D02', D12', D22', D32' (see FIG. 8C) of the charged particle beam in each mesh M00, M10, M01, M11, M02, M12, f22, f32 (see FIG. 6B) is calculated by the proximity effect correction dose calculating portion 10$b$1$b$3 (see FIG. 2), on the basis of area of each representative figure f00, f10, f20$a$, f30$a$, f40$a$, f50$a$, f60$a$, f01, f11, f02, f12, f22, f32 (see FIG. 8B) in each mesh M00, M10, M20, M30, M40, M50, M60, M01, M11, M02, M12, f22, f32 (see FIG. 6B). Proximity effect correction dose D20', D30', D40', D50', D60' (see FIG. 8C) of the charged particle beam in each mesh M20, M30, M40, M50, M60 (see FIG. 6B) is calculated by the proximity effect correction dose calculating portion 10$b$1$b$3 (see FIG. 2), on the basis of area of each representative figure f00, f10, f20$a$, f30$a$, f40$a$, f50$a$, f60$a$, f01, f11, f02, f12, f22, f32 (see FIG. 8B) in each mesh M00, M10, M20, M30, M40, M50, M60, M01, M11, M02, M12, f22, f32 (see FIG. 6B).

In other words, if the area Sf20$a$, Sf30$a$, Sf40$a$, Sf50$a$, Sf60$a$ (see FIG. 8B) of each representative figure f20$a$, f30$a$, f40$a$, f50$a$, f60$a$ (see FIG. 8B) in each mesh M20, M30, M40, M50, M60 (see FIG. 6B) is enlarged with respect to the area Sf20, Sf30, Sf40, Sf50, Sf60 (see FIG. 8B) of each representative figure f20, f30, f40, f50, f60 (see FIG. 6C) as shown in FIG. 8B, the enlargement of the area Sf20$a$, Sf30$a$, Sf40$a$, Sf50$a$, Sf60$a$ (see FIG. 8B) of each representative figure f20$a$, f30$a$, f40$a$, f50$a$, f60$a$ (see FIG. 8B) in each mesh M20, M30, M40, M50, M60 (see FIG. 6B) has an influence on surrounding meshes M00, M10, M01, M11, M02, M12, M22, M32 (see FIG. 6B). Accordingly, proximity effect correction dose D00', D10', D01', D11', D02', D12', D22', D32' (see FIG. 8C) of the charged particle beam in each mesh M00, M10, M01, M11, M02, M12, M22, M32 (see FIG. 6B) is different from proximity effect correction dose D00, D10, D01, D11, D02, D12, D22, D32 (see FIG. 6D) of the charged particle beam in each mesh M00, M10, M01, M11, M02, M12, M22, M32 (see FIG. 6B).

Then, in the charged particle beam drawing apparatus 10 of the first embodiment, proximity effect correction dose D20', D30', D40', D50', D60' (see FIG. 8C) of the charged particle beam for drawing patterns corresponding to the figure FG02 (see FIG. 8A) is changed by a proximity effect correction dose changing portion 10$b$1$b$4 (see FIG. 2), wherein it is necessary to change the proximity effect correction dose of the charged particle beam for drawing patterns corresponding to the figure FG02 (see FIG. 8A).

In detail, in the example shown in FIGS. 8A, 8B and 8C, the proximity effect correction dose D20' (see FIG. 8C) of the charged particle beam in mesh M20 (see FIG. 6B) calculated by the proximity effect correction dose calculating portion 10$b$1$b$3 (see FIG. 2) is changed by the proximity effect correction dose changing portion 10$b$1$b$4 (see FIG. 2). Accordingly, the proximity effect correction dose D20$b$ (see FIG. 8C) of the charged particle beam in the mesh M20 (see FIG. 6B), which is changed from the proximity effect correction dose D20' (see FIG. 8C), is x1 percent larger than the proximity effect correction dose D20' (see FIG. 8C) (D20$b$=D20'×(1+x1/100)).

In the example shown in FIGS. 8A, 8B and 8C, the proximity effect correction dose D30' (see FIG. 8C) of the charged particle beam in mesh M30 (see FIG. 6B) calculated by the proximity effect correction dose calculating portion 10$b$1$b$3 (see FIG. 2) is changed by the proximity effect correction dose changing portion 10b1b4 (see FIG. 2). Accordingly, the proximity effect correction dose D30b (see FIG. 8C) of the charged particle beam in the mesh M30 (see FIG. 6B), which is changed from the proximity effect correction dose D30' (see FIG. 8C), is x1 percent larger than the proximity effect correction dose D30' (see FIG. 8C) (D30b=D30'×(1+x1/100)).

In the example shown in FIGS. 8A, 8B and 8C, the proximity effect correction dose D40' (see FIG. 8C) of the charged particle beam in mesh M40 (see FIG. 6B) calculated by the proximity effect correction dose calculating portion 10b1b3 (see FIG. 2) is changed by the proximity effect correction dose changing portion 10b1b4 (see FIG. 2). Accordingly, the proximity effect correction dose D40b (see FIG. 8C) of the charged particle beam in the mesh M40 (see FIG. 6B), which is changed from the proximity effect correction dose D40' (see FIG. 8C), is x1 percent larger than the proximity effect correction dose D40' (see FIG. 8C) (D40b=D40'×(1+x1/100)).

In the example shown in FIGS. 8A, 8B and 8C, the proximity effect correction dose D50' (see FIG. 8C) of the charged particle beam in mesh M50 (see FIG. 6B) calculated by the proximity effect correction dose calculating portion 10b1b3 (see FIG. 2) is changed by the proximity effect correction dose changing portion 10b1b4 (see FIG. 2). Accordingly, the proximity effect correction dose D50b (see FIG. 8C) of the charged particle beam in the mesh M50 (see FIG. 6B), which is changed from the proximity effect correction dose D50' (see FIG. 8C), is x1 percent larger than the proximity effect correction dose D50' (see FIG. 8C) (D50b=D50'×(1+x1/100)).

In the example shown in FIGS. 8A, 8B and 8C, the proximity effect correction dose D60' (see FIG. 8C) of the charged particle beam in mesh M60 (see FIG. 6B) calculated by the proximity effect correction dose calculating portion 10b1b3 (see FIG. 2) is changed by the proximity effect correction dose changing portion 10b1b4 (see FIG. 2). Accordingly, the proximity effect correction dose D60b (see FIG. 8C) of the charged particle beam in the mesh M60 (see FIG. 6B), which is changed from the proximity effect correction dose D60' (see FIG. 8C), is x1 percent larger than the proximity effect correction dose D60' (see FIG. 8C) (D60b=D60'×(1+x1/100)).

In the example shown in FIGS. 8A, 8B and 8C, the proximity effect correction dose of the charged particle beam for drawing patterns corresponding to the shot figures S01a, S01b (see FIG. 7) is D00' (see FIG. 8C). The proximity effect correction dose of the charged particle beam for drawing a pattern corresponding to the shot figure S01c (see FIG. 7) is D10' (see FIG. 8C). The proximity effect correction dose of the charged particle beam for drawing a pattern corresponding to the shot figure S02a (see FIG. 7) is D20b (see FIG. 8C). The proximity effect correction dose of the charged particle beam for drawing patterns corresponding to the shot figures S02b, S02c (see FIG. 7) is D30b (see FIG. 8C). The proximity effect correction dose of the charged particle beam for drawing patterns corresponding to the shot figures S02d, S02e (see FIG. 7) is D40b (see FIG. 8C). The proximity effect correction dose of the charged particle beam for drawing patterns corresponding to the shot figures S02f, S02g (see FIG. 7) is D50b (see FIG. 8C). The proximity effect correction dose of the charged particle beam for drawing a pattern corresponding to the shot figure S02h (see FIG. 7) is D60b (see FIG. 8C).

In other words, in the charged particle beam drawing apparatus 10 of the first embodiment, if a correction error appears to the patterns locally in the unit drawing area, such as the chip CP1 (see FIG. 4), and the actual width of the linear pattern corresponding to the figure FG02 (see FIG. 8A) is smaller than the target width of the linear pattern, the proximity effect correcting process is performed as shown in FIGS. 8A, 8B and 8C. Consequently, in the charged particle beam drawing apparatus 10 of the first embodiment, the correction error, which appears to the patterns locally in the unit drawing area, such as the chip CP1 (see FIG. 4), can be solved. Namely, the correction error, which does not appear to patterns corresponding to the figure FG01 (see FIG. 8A), but appears to patterns corresponding to the figure FG02 (see FIG. 8A), can be solved.

In the charged particle beam drawing apparatus 10 of the first embodiment, if a correction error appears to the patterns locally in the unit drawing area, such as the chip CP1 (see FIG. 4), and the actual width of the linear pattern corresponding to the figure FG02 (see FIG. 9A) is larger than the target width of the linear pattern, a proximity effect correcting map (see FIG. 9A) having meshes (see FIG. 9A) is formed by the proximity effect correcting map forming portion 10b1b1 (see FIG. 2), for example, the size of each mesh being 2 μm×2 μm (see FIG. 9A), so that the figures FG01, FG02 (see FIG. 9A) are placed in the proximity effect correcting map (see FIG. 9A).

Then, in the charged particle beam drawing apparatus 10 of the first embodiment, before representative figures f20, f30, f40, f50, f60 (see FIG. 6C) are formed by the representative figure forming portion 10b1b2 (see FIG. 2), the area of the figure FG02 (see FIG. 9A) is changed by the figure area changing portion 10b1b2a (see FIG. 2), so that the area of the figure FG02 (see FIG. 9A) decreases, namely, the figure FG02 (see FIG. 9A) is reduced, wherein it is necessary to change the proximity effect correction dose of the charged particle beam for drawing patterns corresponding to the figure FG02 (see FIG. 9A).

Then, in the charged particle beam drawing apparatus 10 of the first embodiment, representative figures f00, f10, f01, f11, f02, f12, f22, f32 (see FIG. 9B) are formed by the representative figure forming portion 10b1b2 (see FIG. 2), wherein area of each representative figure f00, f10, f01, f11, f02, f12, f22, f32 (see FIG. 9B) is equal to gross area of the figure FG01 (see FIG. 9A) placed in each mesh M00, M10, M01, M11, M02, M12, f22, f32 (see FIG. 6B). And representative figures f20c, f30c, f40c, f50c, f60c (see FIG. 9B) are formed by the representative figure forming portion 10b1b2 (see FIG. 2), wherein area of each representative figure f20c, f30c, f40c, f50c, f60c (see FIG. 9B) is equal to gross area of reduced figure FG02 (not shown) placed in each mesh M20, M30, M40, M50, M60 (see FIG. 6B).

In detail, in the example shown in FIGS. 9A, 9B and 9C, the area Sf20c (see FIG. 9B) of representative figure f20c (see FIG. 9B) is x2 percent smaller than the area Sf20 (see FIG. 9B) of representative figure f20 (see FIG. 6C) (Sf20c=Sf20×(1−x2/100)). The area Sf30c (see FIG. 9B) of representative figure f30c (see FIG. 9B) is x2 percent smaller than the area Sf30 (see FIG. 9B) of representative figure f30 (see FIG. 6C) (Sf30c=Sf30×(1−x2/100)). The area Sf40c (see FIG. 9B) of representative figure f40c (see FIG. 9B) is x2 percent smaller than the area Sf40 (see FIG. 9B) of representative figure f40 (see FIG. 6C) (Sf40c=Sf40×(1−x2/100)). The area Sf50c (see FIG. 9B) of representative figure f50c (see FIG. 9B) is x2 percent smaller than the area Sf50 (see FIG. 9B) of representative figure f50 (see FIG. 6C) (Sf50c=Sf50×(1−x2/100)). The area Sf60c (see FIG. 9B) of representative figure f60c (see FIG. 9B) is x2 percent smaller than the area Sf60 (see FIG. 9B) of representative figure f60 (see FIG. 6C) (Sf60c=Sf60×(1−x2/100)).

Then, in the charged particle beam drawing apparatus 10 of the first embodiment, proximity effect correction dose D00", D10", D01", D11', D02", D12", D22", D32" (see FIG. 9C) of the charged particle beam in each mesh M00, M10, M01, M11, M02, M12, f22, f32 (see FIG. 6B) is calculated by the proximity effect correction dose calculating portion 10$b$1$b$3 (see FIG. 2), on the basis of area of each representative figure f00, f10, f20$c$, f30$c$, f40$c$, f50$c$, f60$c$, f01, f11, f02, f12, f22, f32 (see FIG. 9B) in each mesh M00, M10, M20, M30, M40, M50, M60, M01, M11, M02, M12, f22, f32 (see FIG. 6B). Proximity effect correction dose D20", D30", D40", D50", D60" (see FIG. 9C) of the charged particle beam in each mesh M20, M30, M40, M50, M60 (see FIG. 6B) is calculated by the proximity effect correction dose calculating portion 10$b$1$b$3 (see FIG. 2), on the basis of area of each representative figure f00, f10, f20$c$, f30$c$, f40$c$, f50$c$, f60$c$, f01, f11, f02, f12, f22, f32 (see FIG. 9B) in each mesh M00, M10, M20, M30, M40, M50, M60, M01, M11, M02, M12, f22, f32 (see FIG. 6B).

Then, in the charged particle beam drawing apparatus 10 of the first embodiment, proximity effect correction dose D20", D30", D40", D50", D60" (see FIG. 9C) of the charged particle beam for drawing patterns corresponding to the figure FG02 (see FIG. 9A) is changed by the proximity effect correction dose changing portion 10$b$1$b$4 (see FIG. 2), wherein it is necessary to change the proximity effect correction dose of the charged particle beam for drawing patterns corresponding to the figure FG02 (see FIG. 9A).

In detail, in the example shown in FIGS. 9A, 9B and 9C, the proximity effect correction dose D20" (see FIG. 9C) of the charged particle beam in mesh M20 (see FIG. 6B) calculated by the proximity effect correction dose calculating portion 10$b$1$b$3 (see FIG. 2) is changed by the proximity effect correction dose changing portion 10$b$1$b$4 (see FIG. 2). Accordingly, the proximity effect correction dose D20$d$ (see FIG. 9C) of the charged particle beam in the mesh M20 (see FIG. 6B), which is changed from the proximity effect correction dose D20" (see FIG. 9C), is x2 percent smaller than the proximity effect correction dose D20" (see FIG. 9C) (D20$d$=D20"×(1−x2/100)).

In the example shown in FIGS. 9A, 9B and 9C, the proximity effect correction dose D30" (see FIG. 9C) of the charged particle beam in mesh M30 (see FIG. 6B) calculated by the proximity effect correction dose calculating portion 10$b$1$b$3 (see FIG. 2) is changed by the proximity effect correction dose changing portion 10$b$1$b$4 (see FIG. 2). Accordingly, the proximity effect correction dose D30$d$ (see FIG. 9C) of the charged particle beam in the mesh M30 (see FIG. 6B), which is changed from the proximity effect correction dose D30" (see FIG. 9C), is x2 percent smaller than the proximity effect correction dose D30" (see FIG. 9C) (D30$d$=D30"×(1−x2/100)).

In the example shown in FIGS. 9A, 9B and 9C, the proximity effect correction dose D40" (see FIG. 9C) of the charged particle beam in mesh M40 (see FIG. 6B) calculated by the proximity effect correction dose calculating portion 10$b$1$b$3 (see FIG. 2) is changed by the proximity effect correction dose changing portion 10$b$1$b$4 (see FIG. 2). Accordingly, the proximity effect correction dose D40$d$ (see FIG. 9C) of the charged particle beam in the mesh M40 (see FIG. 6B), which is changed from the proximity effect correction dose D40" (see FIG. 9C), is x2 percent smaller than the proximity effect correction dose D40" (see FIG. 9C) (D40$d$=D40"×(1−x2/100)).

In the example shown in FIGS. 9A, 9B and 9C, the proximity effect correction dose D50" (see FIG. 9C) of the charged particle beam in mesh M50 (see FIG. 6B) calculated by the proximity effect correction dose calculating portion 10$b$1$b$3 (see FIG. 2) is changed by the proximity effect correction dose changing portion 10$b$1$b$4 (see FIG. 2). Accordingly, the proximity effect correction dose D50$d$ (see FIG. 9C) of the charged particle beam in the mesh M50 (see FIG. 6B), which is changed from the proximity effect correction dose D50" (see FIG. 9C), is x2 percent smaller than the proximity effect correction dose D50" (see FIG. 9C) (D50$d$=D50"×(1−x2/100)).

In the example shown in FIGS. 9A, 9B and 9C, the proximity effect correction dose D60" (see FIG. 9C) of the charged particle beam in mesh M60 (see FIG. 6B) calculated by the proximity effect correction dose calculating portion 10$b$1$b$3 (see FIG. 2) is changed by the proximity effect correction dose changing portion 10$b$1$b$4 (see FIG. 2). Accordingly, the proximity effect correction dose D60$d$ (see FIG. 9C) of the charged particle beam in the mesh M60 (see FIG. 6B), which is changed from the proximity effect correction dose D60" (see FIG. 9C), is x2 percent smaller than the proximity effect correction dose D60" (see FIG. 9C) (D60$d$=D60"×(1−x2/100)).

In the example shown in FIGS. 9A, 9B and 9C, the proximity effect correction dose of the charged particle beam for drawing patterns corresponding to the shot figures S01$a$, S01$b$ (see FIG. 7) is D00" (see FIG. 9C). The proximity effect correction dose of the charged particle beam for drawing a pattern corresponding to the shot figure S01$c$ (see FIG. 7) is D10" (see FIG. 9C). The proximity effect correction dose of the charged particle beam for drawing a pattern corresponding to the shot figure S02$a$ (see FIG. 7) is D20$d$ (see FIG. 9C). The proximity effect correction dose of the charged particle beam for drawing patterns corresponding to the shot figures S02$b$, S02$c$ (see FIG. 7) is D30$d$ (see FIG. 9C). The proximity effect correction dose of the charged particle beam for drawing patterns corresponding to the shot figures S02$d$, S02$e$ (see FIG. 7) is D40$d$ (see FIG. 9C). The proximity effect correction dose of the charged particle beam for drawing patterns corresponding to the shot figures S02$f$, S02$g$ (see FIG. 7) is D50$d$ (see FIG. 9C). The proximity effect correction dose of the charged particle beam for drawing a pattern corresponding to the shot figure S02$h$ (see FIG. 7) is D60$d$ (see FIG. 9C).

In other words, in the charged particle beam drawing apparatus 10 of the first embodiment, if a correction error appears to the patterns locally in the unit drawing area, such as the chip CP1 (see FIG. 4), and the actual width of the linear pattern corresponding to the figure FG02 (see FIG. 9A) is larger than the target width of the linear pattern, the proximity effect correcting process is performed as shown in FIGS. 9A, 9B and 9C. Consequently, in the charged particle beam drawing apparatus 10 of the first embodiment, the correction error, which appears to the patterns locally in the unit drawing area, such as the chip CP1 (see FIG. 4), can be solved. Namely, the correction error, which does not appear to patterns corresponding to the figure FG01 (see FIG. 9A), but appears to patterns corresponding to the figure FG02 (see FIG. 9A), can be solved.

FIGS. 10A, 10B, 11A, 11B, 11C, 11D, 12A, 12B, 13A, 13B, 14A, 14B, 15A and 15B show examples in which changing the proximity effect correction dose of the charged particle beam for drawing patterns corresponding to figures included in the drawing data D (see FIG. 1) being necessary or unnecessary is distinguished. In detail, FIG. 10A shows a part of a list of the drawing data D (see FIG. 1). FIG. 10B shows a table of relation between index numbers and changing ratio included in the drawing data D.

In the example shown in FIGS. 10A and 10B, a type code "1" of figures FG10, FG11, FG12 included in a first figure group data is understood by reading a header (see FIG. 10A) of the first figure group data (see FIG. 10A). An index number "01" of the figures FG10, FG11, FG12 included in the first figure group data is understood, by reading an index number list (see FIG. 10A) of the first figure group data.

In the example shown in FIGS. 10A and 10B, changing ratio "0%" of the figures FG10, FG11, FG12 included in the first figure group data and corresponding to index number "01" is understood, by reading the table (see FIG. 10B) of relation between index numbers and changing ratio. Consequently, in the example shown in FIGS. 10A and 10B, changing the proximity effect correction dose of the charged particle beam for drawing patterns corresponding to the figures FG10, FG11, FG12 (see FIG. 10A) included in the first figure group data as well as the figure FG01 (see FIG. 8A) being unnecessary, is understood.

In the example shown in FIGS. 10A and 10B, a type code "2" of figures FG20, FG21, FG22 included in a second figure group data is understood by reading a header (see FIG. 10A) of the second figure group data (see FIG. 10A). An index number "02" of the figures FG20, FG21, FG22 included in the second figure group data is understood, by reading an index number list (see FIG. 10A) of the second figure group data.

In the example shown in FIGS. 10A and 10B, changing ratio "+20%" of the figures FG20, FG21, FG22 included in the second figure group data and corresponding to index number "02" is understood, by reading the table (see FIG. 10B) of relation between index numbers and changing ratio. Consequently, in the example shown in FIGS. 10A and 10B, changing the proximity effect correction dose of the charged particle beam for drawing patterns corresponding to the figures FG20, FG21, FG22 (see FIG. 10A) included in the second figure group data as well as the figure FG02 (see FIG. 8A) being necessary, is understood.

In detail, in the example shown in FIGS. 10A and 10B, the area of the figures FG20, FG21, FG22 (see FIG. 10A) is changed by the figure area changing portion 10b1b2a (see FIG. 2), so that the area of the figures FG20, FG21, FG22 (see FIG. 10A) is 20 percent increased on the basis of the changing ratio "+20%". Then, proximity effect correction dose of the charged particle beam for drawing patterns corresponding to the figures FG20, FG21, FG22 (see FIG. 10A) calculated by the proximity effect correction dose calculating portion 10b1b3 (see FIG. 2) is changed by the proximity effect correction dose changing portion 10b1b4 (see FIG. 2), so that the proximity effect correction dose of the charged particle beam for drawing the patterns corresponding to the figures FG20, FG21, FG22 (see FIG. 10A) is 20 percent increased on the basis of the changing ratio "+20%".

In the example shown in FIGS. 10A and 10B, a data of figure FG10 includes at least position and shape of the figure FG10, a data of figure FG11 includes at least position and shape of the figure FG11, a data of figure FG12 includes at least position and shape of the figure FG12, a data of figure FG20 includes at least position and shape of the figure FG20, a data of figure FG21 includes at least position and shape of the figure FG21, and a data of figure FG22 includes at least position and shape of the figure FG22.

In the example shown in FIGS. 10A and 10B, the first figure group data includes "index number list (index number=01)", and the second figure group data includes "index number list (index number=02)". In another example (not shown), the first figure group data can include "changing ratio=0%", and the second figure group data can include "changing ratio=+20%".

FIG. 11A shows an example wherein three cells CL1, CL2, CL3, which have the same size, are placed in the same position in the drawing data D (see FIG. 1). In FIG. 11B, the cell CL1 is selected from the three cells CL1, CL2, CL3 (see FIG. 11A). In FIG. 11C, the cell CL2 is selected from the three cells CL1, CL2, CL3 (see FIG. 11A). In FIG. 11D, the cell CL3 is selected from the three cells CL1, CL2, CL3 (see FIG. 11A).

In the example shown in FIGS. 11A, 11B, 11C and 11D, a figure FG30 belongs to the cell CL1, figures FG40, FG41, FG42, FG43, FG44, FG45, FG46, FG47 belong to the cell CL2, and figures FG50, FG51 belong to the cell CL3.

FIGS. 12A and 12B show an example in which changing the proximity effect correction dose of the charged particle beam for drawing patterns corresponding to figures FG30, FG40, FG41, FG42, FG43, FG44, FG45, FG46, FG47, FG50, FG51 (see FIGS. 11A, 11B, 11C and 11D) being necessary or unnecessary is distinguished. In detail, FIG. 12A shows a part of a list of the drawing data D (see FIG. 1). FIG. 12B shows a table of relation between index numbers and changing ratio included in the drawing data D.

In the example shown in FIGS. 12A and 12B, a data of cell CL1 (see FIG. 12A) in a cell reference information (see FIG. 12A) includes at least a position of the cell CL1 (see FIGS. 11A and 11B) and a pointer for linking up with a portion concerning the cell CL1 in a cell pattern data (see FIG. 12A). Accordingly, as shown in FIG. 12A by an arrow, a header (see FIG. 12A) of the portion concerning the cell CL1 in the cell pattern data can be read by reading the pointer included in the data of the cell CL1.

Then, in the example shown in FIGS. 12A and 12B, the index number "01" of the figure FG30 (see FIGS. 11A and 11B) belonging to the cell CL1 (see FIGS. 11A and 11B) is understood by reading an index number list (see FIG. 12A) concerning the cell CL1 in the cell pattern data. The changing ratio "0%" of the figure FG30 corresponding to the index number "01" is understood by reading the table of relation between index numbers and changing ratio (see FIG. 12B).

Consequently, in the example shown in FIGS. 12A and 12B, changing the proximity effect correction dose of the charged particle beam for drawing patterns corresponding to the figure FG30 (see FIGS. 11A and 11B) belonging to the cell CL1 (see FIGS. 11A and 11B) as well as the figure FG01 (see FIG. 8A) being unnecessary, is understood.

In the example shown in FIGS. 12A and 12B, a data of cell CL2 (see FIG. 12A) in the cell reference information (see FIG. 12A) includes at least a position of the cell CL2 (see FIGS. 11A and 11C) and a pointer for linking up with a portion concerning the cell CL2 in the cell pattern data (see FIG. 12A). Accordingly, as shown in FIG. 12A by an arrow, a header (see FIG. 12A) of the portion concerning the cell CL2 in the cell pattern data can be read by reading the pointer included in the data of the cell CL2.

Then, in the example shown in FIGS. 12A and 12B, the index number "02" of the figures FG40, FG41, FG42, FG43, FG44, FG45, FG46, FG47 (see FIGS. 11A and 11C) belonging to the cell CL2 (see FIGS. 11A and 11C) is understood by reading an index number list (see FIG. 12A) concerning the cell CL2 in the cell pattern data. The changing ratio "+20%" of the figures FG40, FG41, FG42, FG43, FG44, FG45, FG46, FG47 corresponding to the index number "02" is understood by reading the table of relation between index numbers and changing ratio (see FIG. 12B).

Consequently, in the example shown in FIGS. 12A and 12B, changing the proximity effect correction dose of the charged particle beam for drawing patterns corresponding to the figures FG40, FG41, FG42, FG43, FG44, FG45, FG46, FG47 (see FIGS. 11A and 11C) belonging to the cell CL2 (see FIGS. 11A and 11C) as well as the figure FG02 (see FIG. 8A) being necessary, is understood.

In detail, in the example shown in FIGS. 12A and 12B, the area of the figures FG40, FG41, FG42, FG43, FG44, FG45, FG46, FG47 (see FIGS. 11A and 11C) is changed by the figure area changing portion 10b1b2a (see FIG. 2), so that the area of the figures FG40, FG41, FG42, FG43, FG44, FG45, FG46, FG47 (see FIGS. 11A and 11C) is 20 percent increased on the basis of the changing ratio "+20%". Then, proximity effect correction dose of the charged particle beam for drawing patterns corresponding to the figures FG40, FG41, FG42, FG43, FG44, FG45, FG46, FG47 (see FIGS. 11A and 11C) calculated by the proximity effect correction dose calculating portion 10b1b3 (see FIG. 2) is changed by the proximity effect correction dose changing portion 10b1b4 (see FIG. 2), so that the proximity effect correction dose of the charged particle beam for drawing the patterns corresponding to the figures FG40, FG41, FG42, FG43, FG44, FG45, FG46, FG47 (see FIGS. 11A and 11C) is 20 percent increased on the basis of the changing ratio "+20%".

In the example shown in FIGS. 12A and 12B, a data of cell CL3 (see FIG. 12A) in the cell reference information (see FIG. 12A) includes at least a position of the cell CL3 (see FIGS. 11A and 11D) and a pointer for linking up with a portion concerning the cell CL3 in the cell pattern data (see FIG. 12A). Accordingly, as shown in FIG. 12A by an arrow, a header (see FIG. 12A) of the portion concerning the cell CL3 in the cell pattern data can be read by reading the pointer included in the data of the cell CL3.

Then, in the example shown in FIGS. 12A and 12B, the index number "03" of the figures FG50, FG51 (see FIGS. 11A and 11D) belonging to the cell CL3 (see FIGS. 11A and 11D) is understood by reading an index number list (see FIG. 12A) concerning the cell CL3 in the cell pattern data. The changing ratio "+40%" of the figures FG50, FG51 corresponding to the index number "03" is understood by reading the table of relation between index numbers and changing ratio (see FIG. 12B).

Consequently, in the example shown in FIGS. 12A and 12B, changing the proximity effect correction dose of the charged particle beam for drawing patterns corresponding to the figures FG50, FG51 (see FIGS. 11A and 11D) belonging to the cell CL3 (see FIGS. 11A and 11D) as well as the figure FG02 (see FIG. 8A) being necessary, is understood.

In detail, in the example shown in FIGS. 12A and 12B, the area of the figures FG50, FG51 (see FIGS. 11A and 11D) is changed by the figure area changing portion 10b1b2a (see FIG. 2), so that the area of the figures FG50, FG51 (see FIGS. 11A and 11D) is 40 percent increased on the basis of the changing ratio "+40%". Then, proximity effect correction dose of the charged particle beam for drawing patterns corresponding to the figures FG50, FG51 (see FIGS. 11A and 11D) calculated by the proximity effect correction dose calculating portion 10b1b3 (see FIG. 2) is changed by the proximity effect correction dose changing portion 10b1b4 (see FIG. 2), so that the proximity effect correction dose of the charged particle beam for drawing the patterns corresponding to the figures FG50, FG51 (see FIGS. 11A and 11D) is 40 percent increased on the basis of the changing ratio "+40%".

Figures 13A, 13B:
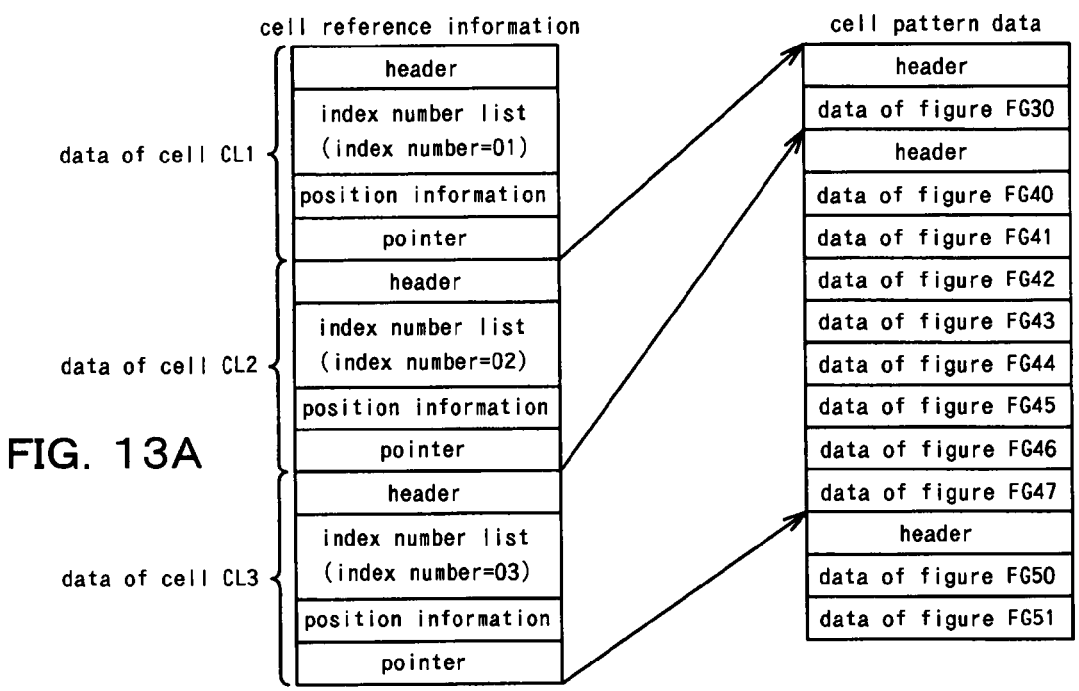
FIGS. 13A and 13B show examples in which changing the proximity effect correction dose of the charged particle beam for drawing patterns corresponding to figures included in the drawing data D being necessary or unnecessary is distinguished.

FIGS. 13A and 13B show an another example in which changing the proximity effect correction dose of the charged particle beam for drawing patterns corresponding to figures FG30, FG40, FG41, FG42, FG43, FG44, FG45, FG46, FG47, FG50, FG51 (see FIGS. 11A, 11B, 11C and 11D) being necessary or unnecessary is distinguished. In detail, FIG. 13A shows a part of a list of the drawing data D (see FIG. 1). FIG. 13B shows a table of relation between index numbers and changing ratio included in the drawing data D.

In the example shown in FIGS. 13A and 13B, a data of cell CL1 (see FIG. 13A) in a cell reference information (see FIG. 13A) includes at least an index number list (see FIG. 13A) of the cell CL1 (see FIGS. 11A and 11B), a position information (see FIG. 13A) of the cell CL1, and a pointer (see FIG. 13A) for linking up with a portion concerning the cell CL1 in a cell pattern data (see FIG. 13A). Accordingly, an index number "01" of the cell CL1 (see FIGS. 11A and 11B) is understood by reading the index number list (see FIG. 13A) of the cell CL1. A changing ratio "0%" corresponding to the index number "01" is understood by reading the table of relation between index numbers and changing ratio (see FIG. 13B). As shown in FIG. 13A by an arrow, a header (see FIG. 13A) of the portion concerning the cell CL1 in the cell pattern data can be read by reading the pointer included in the data of the cell CL1. The figure FG30 (see FIGS. 11A and 11B) belonging to the cell CL1 (see FIGS. 11A and 11B) is understood by reading the portion concerning the cell CL1 in the cell pattern data (see FIG. 13A). The changing ratio "0%" of the figure FG30 belonging to the cell CL1 is understood. Consequently, in the example shown in FIGS. 13A and 13B, changing the proximity effect correction dose of the charged particle beam for drawing patterns corresponding to the figure FG30 (see FIGS. 11A and 11B) belonging to the cell CL1 (see FIGS. 11A and 11B) as well as the figure FG01 (see FIG. 8A) being unnecessary, is understood.

In the example shown in FIGS. 13A and 13B, a data of cell CL2 (see FIG. 13A) in the cell reference information (see FIG. 13A) includes at least an index number list (see FIG. 13A) of the cell CL2 (see FIGS. 11A and 11C), a position information (see FIG. 13A) of the cell CL2, and a pointer (see FIG. 13A) for linking up with a portion concerning the cell CL2 in the cell pattern data (see FIG. 13A). Accordingly, an index number "02" of the cell CL2 (see FIGS. 11A and 11C) is understood by reading the index number list (see FIG. 13A) of the cell CL2. A changing ratio "+20%" corresponding to the index number "02" is understood by reading the table of relation between index numbers and changing ratio (see FIG. 13B). As shown in FIG. 13A by an arrow, a header (see FIG. 13A) of the portion concerning the cell CL2 in the cell pattern data can be read by reading the pointer included in the data of the cell CL2. The figures FG40, FG41, FG42, FG43, FG44, FG45, FG46, FG47 (see FIGS. 11A and 11C) belonging to the cell CL2 (see FIGS. 11A and 11C) is understood by reading the portion concerning the cell CL2 in the cell pattern data (see FIG. 13A). The changing ratio "+20%" of the figures FG40, FG41, FG42, FG43, FG44, FG45, FG46, FG47 belonging to the cell CL2 is understood. Consequently, in the example shown in FIGS. 13A and 13B, changing the proximity effect correction dose of the charged particle beam for drawing patterns corresponding to the figures FG40, FG41, FG42, FG43, FG44, FG45, FG46, FG47 (see FIGS. 11A and 11C) belonging to the cell CL2 (see FIGS. 11A and 11C) as well as the figure FG02 (see FIG. 8A) being necessary, is understood.

In the example shown in FIGS. 13A and 13B, a data of cell CL3 (see FIG. 13A) in the cell reference information (see FIG. 13A) includes at least an index number list (see FIG. 13A) of the cell CL3 (see FIGS. 11A and 11D), a position information (see FIG. 13A) of the cell CL3, and a pointer (see FIG. 13A) for linking up with a portion concerning the cell CL3 in the cell pattern data (see FIG. 13A). Accordingly, an index number "03" of the cell CL3 (see FIGS. 11A and 11D) is understood by reading the index number list (see FIG. 13A) of the cell CL3. A changing ratio "+40%" corresponding to the index number "03" is understood by reading the table of relation between index numbers and changing ratio (see FIG. 13B). As shown in FIG. 13A by an arrow, a header (see FIG. 13A) of the portion concerning the cell CL3 in the cell pattern data can be read by reading the pointer included in the data of the cell CL3. The figures FG50, FG51 (see FIGS. 11A and 11D) belonging to the cell CL3 (see FIGS. 11A and 11D) is understood by reading the portion concerning the cell CL3 in the cell pattern data (see FIG. 13A). The changing ratio "+40%" of the figures FG50, FG51 belonging to the cell CL3 is understood. Consequently, in the example shown in FIGS. 13A and 13B, changing the proximity effect correction dose of the charged particle beam for drawing patterns corresponding to the figures FG50, FG51 (see FIGS. 11A and 11D) belonging to the cell CL3 (see FIGS. 11A and 11D) as well as the figure FG02 (see FIG. 8A) being necessary, is understood.

Figures 14A, 14B:
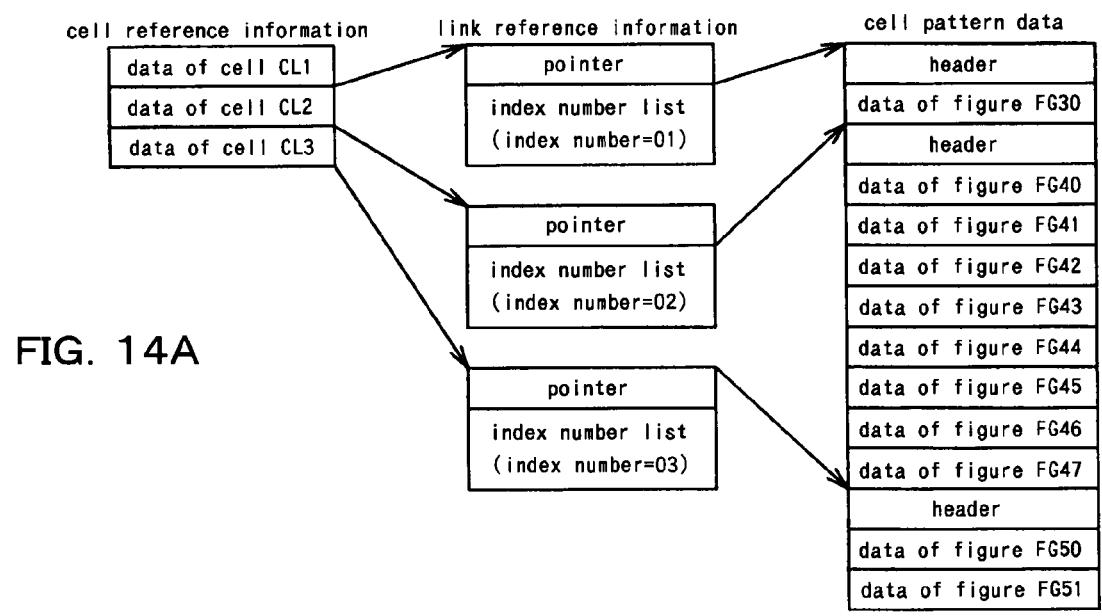
FIGS. 14A and 14B show examples in which changing the proximity effect correction dose of the charged particle beam for drawing patterns corresponding to figures included in the drawing data D being necessary or unnecessary is distinguished.

FIGS. 14A and 14B show an another example in which changing the proximity effect correction dose of the charged particle beam for drawing patterns corresponding to figures FG30, FG40, FG41, FG42, FG43, FG44, FG45, FG46, FG47, FG50, FG51 (see FIGS. 11A, 11B, 11C and 11D) being necessary or unnecessary is distinguished. In detail, FIG. 14A shows a part of a list of the drawing data D (see FIG. 1). FIG. 14B shows a table of relation between index numbers and changing ratio included in the drawing data D.

In the example shown in FIGS. 14A and 14B, a data of cell CL1 (see FIG. 14A) in a cell reference information (see FIG. 14A) includes at least a position of the cell CL1, and a pointer for linking up with a portion concerning the cell CL1 in a link reference information (see FIG. 14A). Accordingly, as shown in FIG. 14A by an arrow, the portion concerning the cell CL1 in the link reference information (see FIG. 14A) can be read by reading the pointer included in the data of the cell CL1 (see FIG. 14A). The portion concerning the cell CL1 (see FIG. 11A and 11B) in the link reference information (see FIG. 14A) includes at least a pointer (see FIG. 14A) for linking up with a header (see FIG. 14A) of a portion concerning the cell CL1 in a cell pattern data (see FIG. 14A), and an index number list (see FIG. 14A) of the cell CL1. Therefore, an index number "01" of the cell CL1 (see FIGS. 14A and 14B) is understood by reading the index number list (see FIG. 14A) of the cell CL1. As shown in FIG. 14A by an arrow, the header of the portion concerning the cell CL1 in the cell pattern data (see FIG. 14A) can be read by reading the pointer included in the portion concerning the cell CL1 in the link reference information. The figure FG30 (see FIGS. 11A and 11B) belonging to the cell CL1 (see FIGS. 11A and 11B) is understood by reading the portion concerning the cell CL1 in the cell pattern data (see FIG. 14A). The changing ratio "0%" of the figure FG30 belonging to the cell CL1 is understood. Consequently, in the example shown in FIGS. 14A and 14B, changing the proximity effect correction dose of the charged particle beam for drawing patterns corresponding to the figure FG30 (see FIGS. 11A and 11B) belonging to the cell CL1 (see FIGS. 11A and 11B) as well as the figure FG01 (see FIG. 8A) being unnecessary, is understood.

In the example shown in FIGS. 14A and 14B, a data of cell CL2 (see FIG. 14A) in the cell reference information (see FIG. 14A) includes at least a position of the cell CL2, and a pointer for linking up with a portion concerning the cell CL2 in the link reference information (see FIG. 14A). Accordingly, as shown in FIG. 14A by an arrow, the portion concerning the cell CL2 in the link reference information (see FIG. 14A) can be read by reading the pointer included in the data of the cell CL2 (see FIG. 14A). The portion concerning the cell CL2 (see FIG. 11A and 11C) in the link reference information (see FIG. 14A) includes at least a pointer (see FIG. 14A) for linking up with a header (see FIG. 14A) of a portion concerning the cell CL2 in the cell pattern data (see FIG. 14A), and an index number list (see FIG. 14A) of the cell CL2. Therefore, an index number "02" of the cell CL2 (see FIGS. 14A and 14C) is understood by reading the index number list (see FIG. 14A) of the cell CL2. As shown in FIG. 14A by an arrow, the header of the portion concerning the cell CL2 in the cell pattern data (see FIG. 14A) can be read by reading the pointer included in the portion concerning the cell CL2 in the link reference information. The figures FG40, FG41, FG42, FG43, FG44, FG45, FG46, FG47 (see FIGS. 11A and 11C) belonging to the cell CL2 (see FIGS. 11A and 11C) is understood by reading the portion concerning the cell CL2 in the cell pattern data (see FIG. 14A). The changing ratio "+20%" of the figures FG40, FG41, FG42, FG43, FG44, FG45, FG46, FG47 belonging to the cell CL2 is understood. Consequently, in the example shown in FIGS. 14A and 14B, changing the proximity effect correction dose of the charged particle beam for drawing patterns corresponding to the figures FG40, FG41, FG42, FG43, FG44, FG45, FG46, FG47 (see FIGS. 11A and 11C) belonging to the cell CL2 (see FIGS. 11A and 11C) as well as the figure FG02 (see FIG. 8A) being necessary, is understood.

In the example shown in FIGS. 14A and 14B, a data of cell CL3 (see FIG. 14A) in the cell reference information (see FIG. 14A) includes at least a position of the cell CL3, and a pointer for linking up with a portion concerning the cell CL3 in the link reference information (see FIG. 14A). Accordingly, as shown in FIG. 14A by an arrow, the portion concerning the cell CL3 in the link reference information (see FIG. 14A) can be read by reading the pointer included in the data of the cell CL3 (see FIG. 14A). The portion concerning the cell CL3 (see FIG. 11A and 11D) in the link reference information (see FIG. 14A) includes at least a pointer (see FIG. 14A) for linking up with a header (see FIG. 14A) of a portion concerning the cell CL3 in the cell pattern data (see FIG. 14A), and an index number list (see FIG. 14A) of the cell CL3. Therefore, an index number "03" of the cell CL3 (see FIGS. 14A and 14D) is understood by reading the index number list (see FIG. 14A) of the cell CL3. As shown in FIG. 14A by an arrow, the header of the portion concerning the cell CL3 in the cell pattern data (see FIG. 14A) can be read by reading the pointer included in the portion concerning the cell CL3 in the link reference information. The figures FG50, FG51 (see FIGS. 11A and 11D) belonging to the cell CL3 (see FIGS. 11A and 11D) is understood by reading the portion concerning the cell CL3 in the cell pattern data (see FIG. 14A). The changing ratio "+40%" of the figures FG50, FG51 belonging to the cell CL3 is understood. Consequently, in the example shown in FIGS. 14A and 14B, changing the proximity effect correction dose of the charged particle beam for drawing patterns corresponding to the figures FG50, FG51 (see FIGS. 11A and 11D) belonging to the cell CL3 (see FIGS. 11A and 11D) as well as the figure FG02 (see FIG. 8A) being necessary, is understood.

In an example shown in FIGS. 15A and 15B, a changing ratio map (see FIG. 15A) having meshes m00, m10, m20, m30, m40, m50, m60, m01, m11, m21, m31, m41, m51, m61, m02, m12, m22, m32, m42, m52, m62 (see FIG. 15A) is formed, for example, the size of each mesh being 100 μm×100 μm (see FIG. 15A), as shown in FIG. 15A, so that changing the proximity effect correction dose of the charged particle beam for drawing patterns corresponding to figures included in the drawing data D (see FIG. 1) being necessary or unnecessary is distinguished.

In detail, in the example shown in FIGS. 15A and 15B, the changing ratio map (see FIG. 15A) having meshes m00, m10, m20, m30, m40, m50, m60, m01, m11, m21, m31, m41, m51, m61, m02, m12, m22, m32, m42, m52, m62 (see FIG. 15A) is formed, so that figures included in the drawing data D (see FIG. 1) are placed in the changing ratio map. In the example shown in FIGS. 15A and 15B, the changing ratio corresponding to the meshes m00, m10, m50, m60, m01, m11, m51, m61, m02, m12, m52, m62 (see FIG. 15A) is 0% (see FIG. 15B). Accordingly, in the example shown in FIGS. 15A and 15B, changing the proximity effect correction dose of the charged particle beam for drawing patterns corresponding to the figures placed in the meshes m00, m10, m50, m60, m01, m11, m51, m61, m02, m12, m52, m62 (see FIG. 15A) as well as the figure FG01 (see FIG. 8A) being unnecessary, is understood.

In the example shown in FIGS. 15A and 15B, the changing ratio corresponding to the meshes m20, m30, m40, m21, m41, m22, m32, m42 (see FIG. 15A) is +5% (see FIG. 15B). Accordingly, in the example shown in FIGS. 15A and 15B, changing the proximity effect correction dose of the charged particle beam for drawing patterns corresponding to the figures placed in the meshes m20, m30, m40, m21, m41, m22, m32, m42 (see FIG. 15A) as well as the figure FG02 (see FIG. 8A) being necessary, is understood.

In detail, in the example shown in FIGS. 15A and 15B, the area of the figures placed in the meshes m20, m30, m40, m21, m41, m22, m32, m42 (see FIG. 15A) is changed by the figure area changing portion $10b1b2a$ (see FIG. 2), so that the area of the figures placed in the meshes m20, m30, m40, m21, m41, m22, m32, m42 (see FIG. 15A) is 5 percent increased on the basis of the changing ratio "+5%". Then, proximity effect correction dose of the charged particle beam for drawing patterns corresponding to the figures placed in the meshes m20, m30, m40, m21, m41, m22, m32, m42 (see FIG. 15A) calculated by the proximity effect correction dose calculating portion $10b1b3$ (see FIG. 2) is changed by the proximity effect correction dose changing portion $10b1b4$ (see FIG. 2), so that the proximity effect correction dose of the charged particle beam for drawing the patterns corresponding to the figures placed in the meshes m20, m30, m40, m21, m41, m22, m32, m42 (see FIG. 15A) is 5 percent increased on the basis of the changing ratio "+5%".

In the example shown in FIGS. 15A and 15B, the changing ratio corresponding to the mesh m31 (see FIG. 15A) is +10% (see FIG. 15B). Accordingly, in the example shown in FIGS. 15A and 15B, changing the proximity effect correction dose of the charged particle beam for drawing patterns corresponding to the figures placed in the mesh m31 (see FIG. 15A) as well as the figure FG02 (see FIG. 8A) being necessary, is understood.

In detail, in the example shown in FIGS. 15A and 15B, the area of the figures placed in the mesh m31 (see FIG. 15A) is changed by the figure area changing portion $10b1b2a$ (see FIG. 2), so that the area of the figures placed in the mesh m31 (see FIG. 15A) is 10 percent increased on the basis of the changing ratio "+10%". Then, proximity effect correction dose of the charged particle beam for drawing patterns corresponding to the figures placed in the mesh m31 (see FIG. 15A) calculated by the proximity effect correction dose calculating portion $10b1b3$ (see FIG. 2) is changed by the proximity effect correction dose changing portion $10b1b4$ (see FIG. 2), so that the proximity effect correction dose of the charged particle beam for drawing the patterns corresponding to the figures placed in the mesh m31 (see FIG. 15A) is 10 percent increased on the basis of the changing ratio "+10%".

FIGS. 16A, 16B, 16C and 16D explain the proximity effect correcting process performed by the proximity effect correcting portion $10b1b$ in the charged particle beam drawing apparatus 10 of the first embodiment, if figures FG60, FG61 are placed in the same mesh Ma of the proximity effect correcting map, wherein changing the proximity effect correction dose of the charged particle beam for drawing patterns corresponding to the figure FG60 is necessary, and changing the proximity effect correction dose of the charged particle beam for drawing patterns corresponding to the figure FG61 is unnecessary.

In the charged particle beam drawing apparatus 10 of the first embodiment, if the figures FG60, FG61 (see FIG. 16A) are placed in the same mesh Ma (see FIG. 16A) of the proximity effect correcting map (see FIG. 16A), the area of the figure FG60 (see FIGS. 16A and 16B) is changed by the figure area changing portion $10b1b2a$ (see FIG. 2), so that the area of the figure FG60 (see FIGS. 16A and 16B) is xa percent increased on the basis of the changing ratio "+xa %", but the area of the figure FG61 (see FIGS. 16A and 16B) is not changed by the figure area changing portion $10b1b2a$ (see FIG. 2).

Figure 16A:
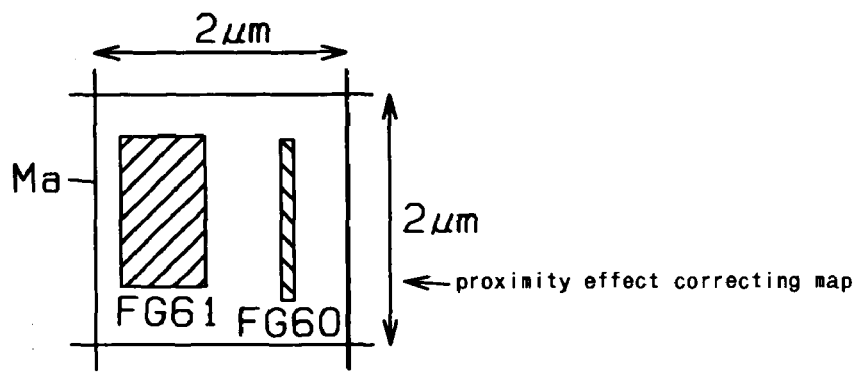
FIGS. 16A, 16B, 16C and 16D explain the proximity effect correcting process performed by the proximity effect correcting portion 10b1b in the charged particle beam drawing apparatus 10 of the first embodiment, if figures FG60, FG61 are placed in the same mesh Ma of the proximity effect correcting map, wherein changing the proximity effect correction dose of the charged particle beam for drawing patterns corresponding to the figure FG60 is necessary, and changing the proximity effect correction dose of the charged particle beam for drawing patterns corresponding to the figure FG61 is unnecessary.
Figure 16B:
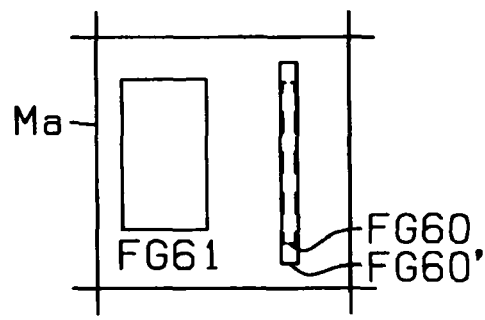

Then, in the charged particle beam drawing apparatus 10 of the first embodiment, a representative figure fa' (see FIG. 16C) is formed by the representative figure forming portion $10b1b2$ (see FIG. 2), wherein area of the representative figure fa' (see FIG. 16C) is equal to gross area of figures FG60', FG61 (see FIG. 16B), and wherein the figure FG60' (see FIG. 16B) is formed by xa percent increasing the area of the figure FG60 (see FIGS. 16A and 16B).

Figure 16C:
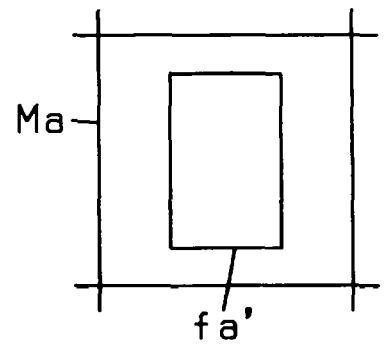
Figure 16D:
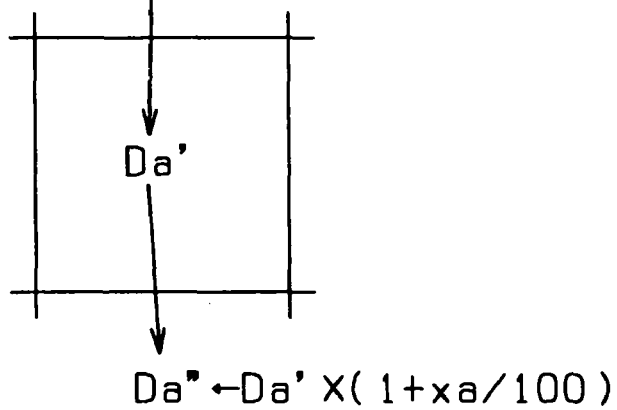

Then, in the charged particle beam drawing apparatus 10 of the first embodiment, proximity effect correction dose Da' (see FIG. 16D) of the charged particle beam for drawing patterns corresponding to the figures FG60, FG61 (see FIG. 16A) is calculated by the proximity effect correction dose calculating portion $10b1b3$ (see FIG. 2), on the basis of area of the representative figure fa' (see FIG. 16C).

Then, in the charged particle beam drawing apparatus 10 of the first embodiment, the proximity effect correction dose Da' (see FIG. 16D) of the charged particle beam for drawing patterns corresponding to the figure FG60 (see FIG. 16A) calculated by the proximity effect correction dose calculating portion $10b1b3$ (see FIG. 2) is changed by the proximity effect correction dose changing portion $10b1b4$ (see FIG. 2), so that the proximity effect correction dose Da' (see FIG. 16D) of the charged particle beam for drawing patterns corresponding to the figure FG60 (see FIG. 16A) is xa percent increased on the basis of the changing ratio "+xa %".

Accordingly, in the charged particle beam drawing apparatus 10 of the first embodiment, the proximity effect correction dose Da" (see FIG. 16D) of the charged particle beam for drawing patterns corresponding to the figure FG60 (see FIG. 16A) is obtained (Da"=Da'×(1+xa/100)).

In the charged particle beam drawing apparatus 10 of the first embodiment, the proximity effect correction dose Da' (see FIG. 16D) of the charged particle beam for drawing patterns corresponding to the figure FG61 (see FIG. 16A) is not changed by the proximity effect correction dose changing portion $10b1b4$ (see FIG. 2).

In other words, in the charged particle beam drawing apparatus 10 of the first embodiment, if the figures FG60, FG61 (see FIG. 16A) are placed in the same mesh Ma (see FIG. 16A) of the proximity effect correcting map (see FIG. 16A), wherein changing the proximity effect correction dose of the charged particle beam for drawing patterns corresponding to the figure FG60 (see FIG. 16A) is necessary, and changing the proximity effect correction dose of the charged particle beam for drawing patterns corresponding to the figure FG61 (see FIG. 16A) is unnecessary, the proximity effect correction dose Da' (see FIG. 16D) of the charged particle beam for drawing patterns corresponding to the figure FG61 (see FIG. 16A) is obtained by the proximity effect correction dose calculating portion 10b1b3 (see FIG. 2), and the proximity effect correction dose Da" (see FIG. 16D) of the charged particle beam for drawing patterns corresponding to the figure FG60 (see FIG. 16A) is obtained by the proximity effect correction dose calculating portion 10b1b3 (see FIG. 2) and the proximity effect correction dose changing portion 10b1b4 (see FIG. 2), respectively.

Accordingly, in the charged particle beam drawing apparatus 10 of the first embodiment, the proximity effect correction dose Da' (see FIG. 16D) of the charged particle beam for drawing patterns corresponding to the figure FG61 (see FIG. 16A), and the proximity effect correction dose Da" (see FIG. 16D) of the charged particle beam for drawing patterns corresponding to the figure FG60 (see FIG. 16A), can be made optimum.

FIG. 17A shows an example wherein three chips CP01, CP02, CP03, which have the same size, are placed in the same position in the drawing data D (see FIG. 1). In FIG. 17B, the chip CP01 is selected from the three chips CP01, CP02, CP03 (see FIG. 17A). In FIG. 17C, the chip CP02 is selected from the three chips CP01, CP02, CP03 (see FIG. 17A). In FIG. 17D, the chip CP03 is selected from the three chips CP01, CP02, CP03 (see FIG. 17A).

In the example shown in FIGS. 17A, 17B, 17C and 17D, a cell CL30 including a plurality of figures belongs to the chip CP01, cells CL40, CL41, CL42, CL43, CL44, CL45, CL46, CL47 including a plurality of figures belong to the chip CP02, and cells CL50, CL51 including a plurality of figures belong to the chip CP03.

In the example shown in FIGS. 17A, 17B, 17C and 17D, the plurality of figures included in the cell CL30 belonging to the chip CP01 correspond to the "index number 01" (see FIG. 12B), the plurality of figures included in the cells CL40, CL41, CL42, CL43, CL44, CL45, CL46, CL47 belonging to the chip CP02 correspond to the "index number 02" (see FIG. 12B), and the plurality of figures included in the cells CL50, CL51 belonging to the chip CP03 correspond to the "index number 03" (see FIG. 12B).

Namely, in the charged particle beam drawing apparatus 10 of the first embodiment, the proximity effect correcting process is performed in the same way as in the example shown in FIGS. 8A, 8B, 8C, 9A, 9B, 9C, 16A, 16B, 16C and 16D, if the correction error appears to the patterns locally in the unit drawing area, the size of the unit drawing area corresponding to the size of a frame of the chips CP01, CP02, CP03 (see FIGS. 17A, 17B, 17C and 17D) (in detail, if the correction error locally appears to the patterns corresponding to figures included in the cells CL40, CL41, CL42, CL43, CL44, CL45, CL46, CL47, CL50, CL51 (see FIGS. 17A, 17B, 17C and 17D), in the unit drawing area).

Accordingly, in the charged particle beam drawing apparatus 10 of the first embodiment, the correction error, which appears to the patterns locally in the unit drawing area, can be solved, wherein the size of the unit drawing area corresponds to the size of the frame of the chips CP01, CP02, CP03 (see FIGS. 17A, 17B, 17C and 17D).

In the charged particle beam drawing apparatus 10 of the third embodiment, above mentioned first and second embodiments, and examples are appropriately combined.

As many apparently widely different embodiments of this invention may be made without departing from the spirit and scope thereof, it is to be understood that the invention is not limited to the specific embodiments thereof except as defined in the appended claims.

What is claimed is:

1. A charged particle beam drawing apparatus, comprising:
a drawing portion for drawing patterns corresponding to figures included in a drawing data, in a drawing area of a workpiece, by irradiating the workpiece with a charged particle beam, wherein the workpiece is formed by applying a resist to an upper surface of the workpiece;
a proximity effect correcting map forming portion for forming a proximity effect correcting map having meshes, so that the figures included in the drawing data are placed in the proximity effect correcting map;
a representative figure forming portion for forming representative figures, wherein area of a representative figure in a mesh is equal to gross area of figures in the mesh;
a proximity effect correction dose calculating portion for calculating a proximity effect correction dose of the charged particle beam in each mesh, on the basis of area of each representative figure in each mesh;
a figure area changing portion for changing area of at least one figure, before the representative figures are formed by the representative figure forming portion, if it is necessary to change the proximity effect correction dose of the charged particle beam for drawing at least one pattern corresponding to the at least one figure; and
a proximity effect correction dose changing portion for changing the proximity effect correction dose of the charged particle beam for drawing the at least one pattern corresponding to the at least one figure, calculated by the proximity effect correction dose calculating portion, if it is necessary to change the proximity effect correction dose of the charged particle beam for drawing the at least one pattern corresponding to the at least one figure.

2. The charged particle beam drawing apparatus according to claim 1, wherein if a correction error appears to the at least one pattern locally in a unit drawing area, the figure area changing portion changes area of the at least one figure corresponding to the at least one pattern, and proximity effect correction dose changing portion changes the proximity effect correction dose of the charged particle beam for drawing the at least one pattern corresponding to the at least one figure.

3. The charged particle beam drawing apparatus according to claim 2, wherein if a first figure and a second figure are placed in a same mesh of the proximity effect correcting map, wherein changing the proximity effect correction dose of the charged particle beam for drawing at least one pattern corresponding to the first figure is necessary, and changing the proximity effect correction dose of the charged particle beam for drawing at least one pattern corresponding to the second figure is unnecessary, the proximity effect correction dose of the charged particle beam for drawing the at least one pattern corresponding to the first figure is obtained by the proximity effect correction dose calculating portion and the proximity effect correction dose changing portion, and the proximity effect correction dose of the charged particle beam for drawing the at least one pattern corresponding to the second figure is obtained by the proximity effect correction dose calculating portion, respectively.

4. The charged particle beam drawing apparatus according to claim 3, wherein if the first figure and the second figure are placed in the same mesh of the proximity effect correcting map, the representative figure forming portion forms a representative figure in the same mesh, wherein area of the representative figure is equal to gross area of the first figure and the second figure, after the area of the first figure is changed by the figure area changing portion, and the proximity effect correction dose changing portion changes the proximity effect correction dose of the charged particle beam for drawing the at least one pattern corresponding to the first figure, calculated by the proximity effect correction dose calculating portion on the basis of the area of the representative figure.

5. The charged particle beam drawing apparatus according to claim 4, wherein if the first figure and the second figure are placed in the same mesh of the proximity effect correcting map, the proximity effect correction dose calculating portion calculates the proximity effect correction dose of the charged particle beam for drawing the at least one pattern corresponding to the second figure on the basis of the area of the representative figure.

6. A proximity effect correction method of a charged particle beam drawing apparatus for drawing patterns corresponding to figures included in a drawing data, in a drawing area of a workpiece, by irradiating the workpiece with a charged particle beam, wherein the workpiece is formed by applying a resist to an upper surface of the workpiece, comprising:
    forming a proximity effect correcting map having meshes by a proximity effect correcting map forming portion, so that the figures included in the drawing data are placed in the proximity effect correcting map;
    forming representative figures by a representative figure forming portion, wherein area of a representative figure in a mesh is equal to gross area of figures in the mesh;
    calculating a proximity effect correction dose of the charged particle beam in each mesh, on the basis of area of each representative figure in each mesh, by a proximity effect correction dose calculating portion;
    changing area of at least one figure by a figure area changing portion, before the representative figures are formed by the representative figure forming portion, if it is necessary to change the proximity effect correction dose of the charged particle beam for drawing at least one pattern corresponding to the at least one figure; and
    changing the proximity effect correction dose of the charged particle beam for drawing the at least one pattern corresponding to the at least one figure, calculated by the proximity effect correction dose calculating portion, by a proximity effect correction dose changing portion, if it is necessary to change the proximity effect correction dose of the charged particle beam for drawing the at least one pattern corresponding to the at least one figure.

7. The proximity effect correction method of the charged particle beam drawing apparatus according to claim 6, wherein if a correction error appears to the at least one pattern locally in a unit drawing area, the figure area changing portion changes area of the at least one figure corresponding to the at least one pattern, and proximity effect correction dose changing portion changes the proximity effect correction dose of the charged particle beam for drawing the at least one pattern corresponding to the at least one figure.

8. The proximity effect correction method of the charged particle beam drawing apparatus according to claim 7, wherein if a first figure and a second figure are placed in a same mesh of the proximity effect correcting map, wherein changing the proximity effect correction dose of the charged particle beam for drawing at least one pattern corresponding to the first figure is necessary, and changing the proximity effect correction dose of the charged particle beam for drawing at least one pattern corresponding to the second figure is unnecessary, the proximity effect correction dose of the charged particle beam for drawing the at least one pattern corresponding to the first figure is obtained by the proximity effect correction dose calculating portion and the proximity effect correction dose changing portion, and the proximity effect correction dose of the charged particle beam for drawing the at least one pattern corresponding to the second figure is obtained by the proximity effect correction dose calculating portion, respectively.

9. The proximity effect correction method of the charged particle beam drawing apparatus according to claim 8, wherein if the first figure and the second figure are placed in the same mesh of the proximity effect correcting map, the representative figure forming portion forms a representative figure in the same mesh, wherein area of the representative figure is equal to gross area of the first figure and the second figure, after the area of the first figure is changed by the figure area changing portion, and the proximity effect correction dose changing portion changes the proximity effect correction dose of the charged particle beam for drawing the at least one pattern corresponding to the first figure, calculated by the proximity effect correction dose calculating portion on the basis of the area of the representative figure.

10. The proximity effect correction method of the charged particle beam drawing apparatus according to claim 9, wherein if the first figure and the second figure are placed in the same mesh of the proximity effect correcting map, the proximity effect correction dose calculating portion calculates the proximity effect correction dose of the charged particle beam for drawing the at least one pattern corresponding to the second figure on the basis of the area of the representative figure.

* * * * *